(12) United States Patent
Schott

(10) Patent No.: US 9,310,224 B2
(45) Date of Patent: Apr. 12, 2016

(54) MAGNETIC FIELD ORIENTATION SENSOR AND ANGULAR POSITION SENSOR USING SAME

(71) Applicant: Melexis Technologies NV, Tessenderlo (BE)

(72) Inventor: Christian Schott, Lussy-sur-Morges (CH)

(73) Assignee: MELEXIS TECHNOLOGIES NV, Tessenderlo (BE)

( * ) Notice: Subject to any disclaimer, the term of this patent is extended or adjusted under 35 U.S.C. 154(b) by 68 days.

(21) Appl. No.: 14/479,510

(22) Filed: Sep. 8, 2014

(65) Prior Publication Data

US 2015/0070002 A1    Mar. 12, 2015

(30) Foreign Application Priority Data

Sep. 6, 2013    (GB) .................................. 1315964.5

(51) Int. Cl.
  *G01B 7/14* (2006.01)
  *G01D 5/14* (2006.01)
  *G01R 33/07* (2006.01)

(52) U.S. Cl.
  CPC ................ *G01D 5/145* (2013.01); *G01R 33/07* (2013.01); *G01R 33/077* (2013.01)

(58) Field of Classification Search
  CPC ..... G01D 5/145; G01D 5/147; G01D 5/2457; G01P 3/487; G01P 3/443; F16H 63/42; F16H 63/20; F16H 63/30; F16H 63/3009; F16H 59/105; F16H 59/042; F16H 59/10; F16H 59/0204; F16H 59/0217; F16H 59/44; F16H 59/70; F16H 59/02078; F16H 61/0293; F16H 61/18; F16H 61/24; F16H 61/0213
  USPC ................................ 324/207.11–207.26, 206
  See application file for complete search history.

(56) References Cited

U.S. PATENT DOCUMENTS 6,326,780 B1 * 12/2001 Striker ............... G01R 33/0011
                                                          324/207.2
7,629,714 B2 * 12/2009 Toyama ................. H02K 33/16
                                                          310/154.08

(Continued)

FOREIGN PATENT DOCUMENTS

| EP | 0916074 B1 | 7/2003 |
| EP | 2000814 B1 | 10/2011 |
| EP | 2153241 B1 | 3/2013 |

OTHER PUBLICATIONS

Extended European Search Report from Application No. EP 14183857.3, Jan. 27, 2015.

(Continued)

*Primary Examiner* — Tung X Nguyen
*Assistant Examiner* — Thang Le
(74) *Attorney, Agent, or Firm* — Workman Nydegger

(57) ABSTRACT

A magnetic field sensor structure having a number of inner, outer and intermediate electrodes, arranged in a particular manner, such that groups of four electrodes can be used to form horizontal Hall elements, whereby neighboring Hall elements "share" one of the two readout electrodes. Multiple Hall elements may be biased and readout simultaneously. A modulated or unmodulated readout-technique may be used. Integrated magnetic concentrator may be added to the structure. The number of Hall elements may be odd or even. The structure can be used e.g. to measure the magnetic field of a 2-pole, 4-pole or 6-pole ring or disk magnet.

16 Claims, 10 Drawing Sheets

(56) References Cited

U.S. PATENT DOCUMENTS

| | | | |
|---|---|---|---|
| 2002/0021124 A1 | 2/2002 | Schott et al. | |
| 2008/0133100 A1* | 6/2008 | Takahashi | B60T 8/171 701/74 |
| 2009/0102460 A1* | 4/2009 | Schott | G01D 5/244 324/207.2 |
| 2009/0121707 A1* | 5/2009 | Schott | G01R 33/0005 324/207.2 |
| 2010/0164491 A1* | 7/2010 | Kejik | G01R 33/077 324/251 |
| 2010/0219821 A1 | 9/2010 | Rocznik et al. | |
| 2013/0057257 A1 | 3/2013 | Friedrich et al. | |

OTHER PUBLICATIONS

Burger et al., "New Fully Integrated 3-D Silicon Hall Sensor for Precise Angular-Position Measurements," Sensors and Actuators A, 1998, pp. 72-76, vol. 67, Elsevier Science S.A.

Great Britain Search Report for corresponding Great Britain Application No. 1315964.5, Jan. 31, 2014.

* cited by examiner

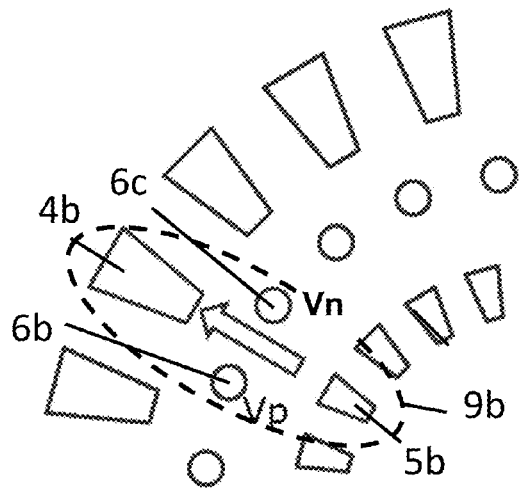
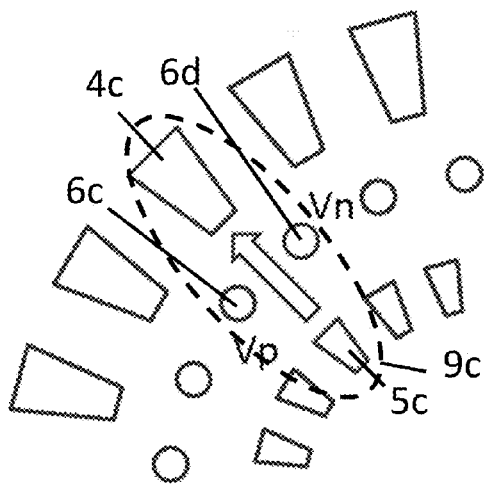
FIG 5  FIG 6
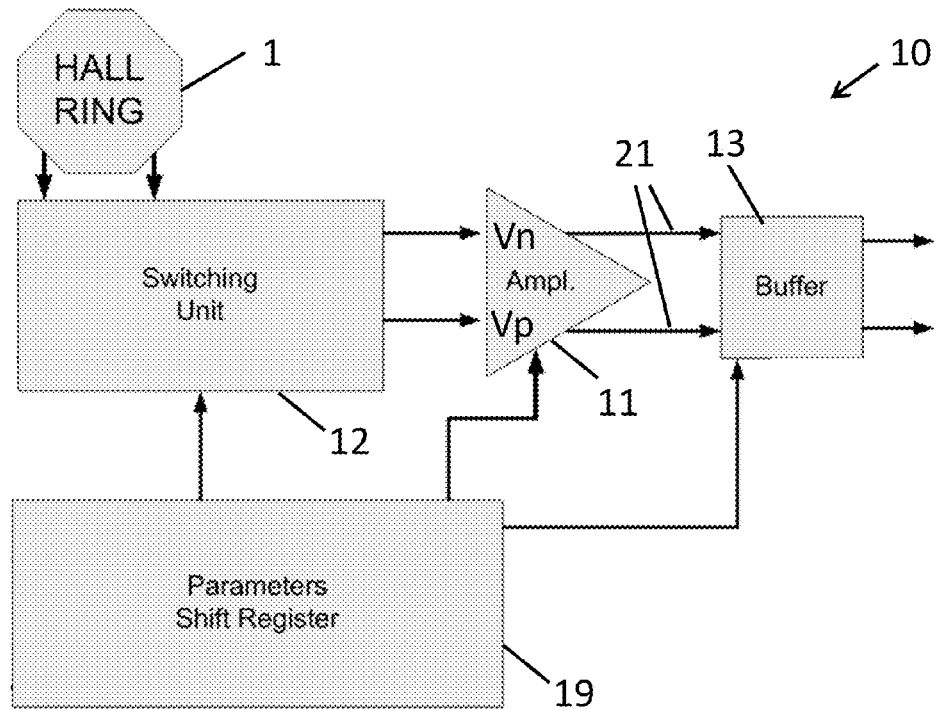
FIG 7

MAGNETIC FIELD ORIENTATION SENSOR AND ANGULAR POSITION SENSOR USING SAME

FIELD OF THE INVENTION

The invention relates to the field of magnetic field sensing, more in particularly to the field of semiconductor structures for sensing magnetic field components, and to magnetic position sensors, in particular angular position sensors.

BACKGROUND OF THE INVENTION

Modern integrated circuit technology offers the possibility to integrate magnetic sensors and their readout and angle determination circuit on a single die. This allows providing detectors of mechanical rotation which consist of a permanent magnet attached to a rotor and a monolithically integrated sensor attached to a stator, at competitive cost and good performance. The absence of mechanical contact between the rotor with the magnet and the stator with the sensor allows for hermetic encapsulation of the sensor. This permits wear-free angle measurements under harsh environmental conditions.

Various structures, devices and methods for measuring such a magnetic field (or field component) are known in the art. Many of them are based on so called "horizontal" or "vertical" Hall elements, which are integrated in the semiconductor devices. Horizontal Hall elements are typically implemented by forming an isolated Hall-plate (semiconductor region), substantially parallel to the plane of the semiconductor device, (hence the name "horizontal"), and are typically in the shape of a square, whereby a current is injected in one corner and drawn from the opposite corner, these corners are referred to as "biasing contacts" or "supply contacts", while a differential voltage (so called Hall voltage) indicative for a magnetic field component $Bz$ vertical to the plane of the sensor plate is measured over the remaining corners, referred to as "sensing contacts", or "readout contacts" or "output contacts". Vertical Hall sensors are primarily built in the depth direction of the silicon, and may e.g. have five contacts on the surface (although less than five is also possible), whereby a current is injected in the middle contact (e.g. by connecting it to a supply voltage VDD), which current is drawn from the outer contacts (e.g. by connecting it to a ground voltage GND), while a differential voltage indicative for a magnetic field component parallel to the semiconductor plane is measured from the remaining two contacts, referred to as "sensing contacts", or "readout contacts" or "output contacts". The middle and outer contacts are referred to as the "supply contacts" or "biasing contacts" of the vertical Hall sensor.

Ideally, in the presence of no magnetic field, the sensors should output zero differential voltage, also referred to as "Hall potential" or "Hall voltage". In practice however, this is not always the case, and a small voltage signal, called offset-voltage is provided, which needs to be compensated. Known methods are e.g. the so called "contact commutation method", also known as "spinning-current method", whereby each electrical contact serves sequentially as supply contact and readout contact.

Another problem is related to the small differential signal generated by such Hall elements, which are typically in the order of 100 microVolts to 1 milliVolt, and thus need to be amplified before it can be used for further processing. Ideally, in the presence of no differential signal, the output of the amplifier should be exactly zero, but in practice it is not, and the offset voltage appears as a DC-offset at the output, which needs to be compensated for.

EP0916074(B1) describes a method and arrangement for contactless angle measurement using a magnetic field originating from a two-pole magnet, whereby an axial field component $Bz$ in parallel with the rotation axis is measured by sensor elements at several spots inside a plane perpendicular to the rotation axis. By measuring two orthogonal field components $Bx$, $By$, the orientation of the magnet can be determined, using goniometric functions.

EP2153241(B1) describes a circular vertical Hall sensor. This sensor uses a circular vertical Hall structure whereby groups of contacts are sequentially scanned in clockwise or anti-clockwise direction. The offset-reduction is done via the well known contact commutation method (or spinning-current method). The angular position of the magnet is determined via the phase of the scanned signal.

Also EP2000814(B1) describes several embodiments of circular vertical Hall sensors. In particular, the embodiment of FIG. 7 uses an outer ring and an inner ring whereby current is flowing in a radial direction, and a differential signal is derived from two sensing electrodes located at opposite sides of the inner ring, at 180° angular distance. In the embodiment of FIG. 10 (replicated as FIG. 1 attached hereto), the outer ring is replaced by individual outer contacts, aligned at the same angular position as the sensing electrode located between the outer contacts and the central ring. In this figure, it is easy to recognize the "five contacts" of the vertical Hall sensor mentioned above, and indicated in black. FIG. 13 (replicated as FIG. 2 attached hereto) shows a block-schematic of a circuit for biasing and reading-out the structure of FIG. 1, and for determining the angular position of the magnetic field.

SUMMARY OF THE INVENTION

It is an object of embodiments of the present invention to provide a good magnetic field sensor, a good magnetic angular position sensor, and/or a good method for determining an angular position of a magnetic field using same.

This objective is accomplished by a magnetic field sensor, and an angular position sensor, and an arrangement, and a method according to embodiments of the present invention.

It is an advantage of embodiments of the present invention that they provide an alternative magnetic field sensor having at least the same advantages as the prior art.

It is an advantage of particular embodiments of the present invention that they provide a magnetic field sensor having a reduced sensitivity to offset-errors, such as misalignment errors.

In a first aspect of the present invention, a magnetic field sensor is provided, comprising:

a structure comprising a ring shaped well provided upon a bulk substrate, and comprising a number of inner electrodes arranged at equidistant angular positions on an inner circle concentric with the well, and the same number of outer electrodes arranged at equidistant angular positions on an outer circle concentric with the well and radially aligned with the inner electrodes for forming pairs of biasing electrodes, and the same number of readout electrodes arranged at equidistant angular positions on an intermediate circle concentric with the well, but angularly shifted with respect to the inner and outer electrodes over 180° divided by said number;

and a biasing-and-readout circuit comprising a plurality of switches for selectively applying a progressive succession of differently directed bias currents to a pair of biasing electrodes, and for selectively reading a differential Hall voltage over a progressive succession of two readout electrodes located at an equal distance to the selected outer biasing electrode, said biasing electrodes and said readout electrodes forming a horizontal Hall element, said differential Hall voltage being indicative of the relative magnitude of a magnetic field components at the location of said Hall element.

This structure is completely different from the prior art structure replicated in FIG. 1: the structure of the present invention does not have an inner ring, and uses Horizontal Hall elements as opposed to Vertical Hall elements, and the readout contacts are not located on opposite sides of the well center, and the contacts are not radially aligned with the outer contacts.

It is an advantage of the structure of the present invention that the ring shaped well may have a circular shape, or a regular polygonal shape, or another rotation symmetrical two-dimensional shape.

It is an advantage of such a structure, that N Hall elements can be formed, which can be biased for measuring a magnetic field component substantially perpendicular to said Hall element. By successively biasing the Hall elements, a waveform can be generated from which the angular position of the magnetic field can be derived.

Although the biasing and readout-circuit is considered part of the magnetic field sensor, the actual angle determination circuitry may be integrated in the same device, or may be located outside of this device.

It is an advantage of the structure of the present invention that it can be used in conjunction with different types of magnetic sources, such as e.g. a two-pole bar magnet, a two-pole ring or disk magnet, a four-pole ring or disk magnet, a six-pole ring or disk magnet, depending on the required angular range/robustness to external fields, etc.

It is an advantage of the structure of the present invention that it allows the number of inner electrodes (which is the same as the number of outer electrodes and the number of intermediate electrodes) to be even, or odd. Suitable numbers may be e.g. 8, 16, 24, 32, 48, 64, but the invention is not restricted hereto, and other numbers can also be used, even odd numbers, such as e.g. 7 or 11 or 13.

In embodiments of the present invention, the structure is always biased in the same radial direction, e.g. inward from the outer electrode towards the inner electrode. This has the advantage that the complexity of the biasing circuit can be reduced, because only one switch is required for each outer electrode, instead of two, and likewise only one switch is required for each inner electrode, instead of two.

It is an advantage of embodiments of the present invention that the biasing can be done by applying a current or a voltage to said pair of biasing electrodes.

It is an advantage of a structure using horizontal Hall elements instead of vertical Hall elements, in that horizontal Hall elements have a sensitivity typically 2× higher than that of vertical Hall elements, and having an offset which is typically 5× smaller than that of vertical Hall elements.

It is an advantage of using individual inner electrodes and individual outer electrodes as compared to an inner ring and/or an outer ring, in that it requires considerably less power.

It is an advantage of this structure that it can be used with or without Integrated Magnetic Concentrator (IMC).

It is an advantage that this structure can be used to provide a modulated or un-modulated sequence of Hall voltages (waveform signal), which in both cases allows to efficiently suppress amplifier offset.

The novel sensor geometry allows to keep supply and readout contacts separate (less switches required) and nevertheless achieve a strong suppression of sensor offset.

In some embodiments, whereby multiple Hall elements are biased and read simultaneously, it is also possible to read the angular position with a magnetic field of a magnet, while being substantially insensitive to a homogenous parasitic field (fremdfeld), as emanating for example from a strong current inside the motor cable of a hybrid car.

In an embodiment, the biasing-and-readout circuit is arranged for selecting the two readout electrodes closest to the selected outer biasing electrode.

It is an advantage of this embodiment that neighboring Hall elements have one intermediate electrode in common. This has two important advantages: (1) Because of this, successive samples of the measured Hall voltages will have correlated values in case of misalignment errors or position errors, which can be largely compensated. Thus the structure has a reduced sensitivity to misalignment errors, position offsets of one or more of the electrodes, a doping gradient, local imperfections due to CMOS technology, mechanical stress, or any combination thereof, without having to use the well-known "spinning-current" principle, thus saving a lot of switches, and simplifying the bias-and-readout circuit; (2) If neighboring Hall devices would not have a common intermediate electrode, the number of intermediate electrodes would have to doubled (because two readout nodes are required per Hall device), and the biasing-and-readout circuit, typically comprising switches, would become more complex.

In an embodiment, the biasing-and-readout circuit is arranged for operating the sensor cyclically, wherein a full progressive succession cycle involves in each step biasing at least one Hall element, and reading the corresponding Hall voltage of that at least one Hall element.

The biasing-and-readout circuit may be arranged for successively selecting the Hall elements in a clock-wise or a counter-clockwise direction. By biasing and reading each Hall element in this way, a series of samples of the Hall voltage is obtained, forming a waveform, typically a sinusoidal waveform, from which the angular position can be derived. It is an advantage of cyclically operating the sensor, in that the resulting signal is periodic, which allows e.g. low-pass-filtering thereof.

Preferably the time for biasing and reading a Hall element in each step of the cycle is substantially equal for each step (apart from clock tolerances, jitter, etc).

In an embodiment, the magnetic field sensor further comprises a differential amplifier having at least one differential port with a positive input and a negative input; and the biasing-and-readout circuit is further adapted for reading the successive differential Hall voltages by connecting in each step the readout electrode located on the left of the biasing electrodes as seen from the center of the well to the positive input of the differential amplifier, and connecting the readout electrode located of the right of the biasing electrodes as seen from the center of the well to the negative input of a differential amplifier.

This embodiment is referred to in this application as the un-modulated readout technique. In this case, the angle determination circuit does not require a demodulator.

In an alternative embodiment, the magnetic field sensor further comprises a differential amplifier having at least one differential port with a positive input and a negative input; and the biasing-and-readout circuit is further adapted for reading the successive differential Hall voltages by connecting in each even step the readout electrode located on the left of the biasing electrodes as seen from the center of the well to the positive input of the differential amplifier, and connecting the readout electrode located of the right of the biasing electrodes as seen from the center of the well to the negative input of a differential amplifier; and by connecting in each odd step the readout electrode located on the left of the biasing electrodes as seen from the center of the well to the negative input of the differential amplifier, and connecting the readout electrode located of the right of the biasing electrodes as seen from the center of the well to the positive input of a differential amplifier.

This embodiment is referred to in this application as the 'modulated readout technique'. The modulating readout-technique corresponds in fact with modulating the sequence of Hall voltage with the vector [+1, −1, +1, −1, etc]. This is easily be implemented by switching the readout electrodes so as to connect either to the positive input or the negative input. This technique is known in the art as chopper modulation, and the main effects of chopper modulation and demodulation is that 1/f noise can be reduced, as well as any DC-offset. The chopper demodulation would be part of the angle detection circuitry, which may be part of the magnetic field sensor, or external thereto.

An additional advantage of the modulated readout technique is that, in the case where the number of electrodes is even, each intermediate electrode 6 will (at some point in time) need to be connected to either the positive or the negative input of the differential amplifier, but not to both of them. Thus, in this case only one switch per intermediate electrode would suffice, whereas two switches per intermediate electrode are required for applying the un-modulated technique.

In an embodiment, the biasing-and-readout is adapted for biasing and reading only a single Hall element in each successive step.

This embodiment (illustrated in FIG. 10) has the advantage that it can be used with any kind of magnet (2-pole, 4-pole, 6-pole, etc), and the structure may have any number of electrodes larger than two times the number of poles of the magnet.

In an alternative embodiment, the number of Hall elements is even; and the biasing-and-readout circuit is adapted for simultaneously biasing and reading a first Hall element for providing a first differential Hall signal and a second Hall element located at 180° angular distance from the first Hall element for providing a second differential Hall signal; and the biasing-and-readout circuit is further adapted for subtracting the first and the second differential Hall signals.

This embodiment (illustrated in FIG. 11) is particularly advantageous when used in conjunction with a two-pole magnet, e.g. a two-pole bar magnet or a two-pole disk magnet, in which case the signals s1 and s2 will typically have the same amplitude but opposite sign, hence by subtracting them, the amplitude is substantially doubled. Another advantage of this embodiment is that it is substantially robust (i.e. has a reduced sensitivity) to a constant external field gradient (fremdfeld).

In an alternative embodiment, the number of Hall elements is even; and the biasing-and-readout circuit is adapted for simultaneously biasing and reading a first Hall element for providing a first differential Hall signal and for biasing and reading a second Hall element located at 180° angular distance from the first Hall element for providing a second differential Hall signal; and the biasing-and-readout circuit is further adapted for adding the first and the second differential Hall signals.

This embodiment (illustrated in FIG. 12) is particularly advantageous when used in conjunction with a multi-pole magnet having at least four poles, e.g. a four-pole magnet or a six-pole magnet. In this embodiment the magnetic field is measured at two locations where the magnetic field component is substantially the same in amplitude and sign, hence the sum will provide a signal with double amplitude.

In an alternative embodiment, the number of Hall elements is an integer multiple of four; and the biasing-and-readout circuit is adapted for simultaneously biasing and reading four Hall element located at 90° angular distance from each other; and the biasing-and-readout circuit is further adapted for determining the output signal as the sum of the signals of the first and the third Hall element minus the sum of the signals of the second and the fourth Hall element.

This embodiment (illustrated in FIG. 13) is particularly advantageous when used in conjunction with a four-pole magnet, or an eight-pole magnet. In this embodiment the magnetic field is measured at four locations where the magnetic field component is substantially the same in amplitude, and the same or opposite in sign, hence by adding and subtracting as indicated, the amplitude of the signal obtained from the sensor is substantially multiplied by four, thus the sensitivity of the sensor is improved. In addition, this sensor is substantially robust, i.e. has a reduced sensitivity against an constant external magnetic field (fremdfeld).

It is a particular advantage of such an embodiment that it may even allow to reduce an external magnetic field gradient (i.e. not only the zero order component of the external field, but also the first order component). This is particularly the case for a six-pole ring or disk magnet, and is described in more detail in the International patent application number PCT/EP2013/067577, filed by the same applicant, on Aug. 23, 2013.

In any of the embodiments described above, the magnetic field sensor may further comprise an integrated magnetic concentrator located on top of the well.

It is an advantage of such a magnetic field sensor that it is not only sensitive to magnetic field components (e.g. from a magnet) that are substantially perpendicular to the sensor plane, but that radial and/or tangential field components of the magnet are bent into a direction substantially perpendicular to the sensor plane, and hence can also be measured by the horizontal Hall elements. It is a further advantage that these bent components are passively amplified by the IMC.

In a second aspect of the present invention, an angular position sensor is provided for determining an angular position with respect to a permanent magnet, the angular position sensor comprising: —a magnetic field sensor according to any of the embodiments described above; and an angle determination circuit for determining an angular position based on the succession of differential Hall signals provided by the biasing-and-readout circuit.

This angular position sensor has the same advantages as the magnetic field sensor structure comprised therein.

In an embodiment, the angle determination circuit comprises a low pass filter or a band-pass filter.

It is an advantage of a band-pass filter that it can remove a DC-component originating from the Hall elements themselves, or from the amplifier. It is an advantage of a low-pass filter and of the band-pass filter that they remove the high-frequency content of the staircase signal, in other words, smooth the signal, such that its zero-crossing can be accurately determined.

In an embodiment whereby the readout signals are modulated before being amplified, the angle determination circuit comprises a demodulator for demodulating the amplified signal.

It is an advantage of embodiments of the present invention that it allows to compensate for offset-errors, in particular DC-offset of the amplifier, without having to use the well known current-spinning technique. It is an advantage that any known demodulator implementation can be used.

In a third aspect of the present invention, an arrangement is provided for measuring an angular position of a rotor with respect to a stator, the arrangement comprising: the rotor rotatable around a rotation axis; the stator having a fixed position with respect to the rotation axis; a permanent magnet mounted on the rotor for creating a magnetic field; an angular position sensor according to the second aspect.

In a fourth aspect, the present invention provides a method of determining an angular position of a magnetic field, using the magnetic field sensor according to the aspect of the present invention, the method comprising the steps: a) selectively applying a progressive succession of differently directed bias currents to a pair of biasing electrodes, and selectively reading a differential Hall voltage over a progressive succession of the two readout electrodes located at an equal distance to the selected outer biasing electrode, the succession of Hall voltages forming a waveform; b) amplifying the waveform; c) low-pass filtering the amplified waveform; d) determining a phase offset ($\phi$) of the low-pass-filtered waveform, as the angular position.

In a fifth aspect, the present invention provides a method of determining an angular position of a magnetic field, using the magnetic field sensor according to an embodiment of the first aspect of the present invention whereby the readout signals are modulated before amplification, the method comprising the steps: a) selectively applying a progressive succession of differently directed bias currents to a pair of biasing electrodes, and selectively reading a differential Hall voltage over a progressive succession of the two readout electrodes located at an equal distance to the selected outer biasing electrode; b) modulating the successively read Hall voltages before amplification; c) amplifying the modulated Hall voltages; d) demodulating the amplified modulated Hall voltages; e) determining a phase offset ($\phi$) of the demodulated waveform, as the angular position.

Particular and preferred aspects of the invention are set out in the accompanying independent and dependent claims. Features from the dependent claims may be combined with features of the independent claims and with features of other dependent claims as appropriate and not merely as explicitly set out in the claims.

These and other aspects of the invention will be apparent from and elucidated with reference to the embodiment(s) described hereinafter.

BRIEF DESCRIPTION OF THE DRAWINGS

FIG. 5 and FIG. 6 illustrate a first readout technique, referred to herein as "un-modulated readout technique".

FIG. 5 shows part of the structure of FIG. 4 in enlarged view, and in a first biasing situation.

FIG. 6 shows part of the structure of FIG. 4 in enlarged view, and in a second biasing situation.

FIG. 7 shows a block-diagram of a circuit that can be used for biasing the structure of FIG. 4, and for measuring the Hall voltages, when exposed to a magnetic field.

FIG. 10 shows schematically a biasing of a single Hall element, (similar to FIG. 5), as can be used in combination with a two-pole ring or disk magnet, for providing a single differential output signal (Hall voltage), which can be amplified.

FIG. 11 shows schematically simultaneous biasing of two Hall elements located on opposite sides of the ring structure, as can be used in combination with a two-pole ring or disk magnet, for providing two differential output signals (Hall voltages) which are subtracted before amplification.

FIG. 12 shows schematically simultaneous biasing of two Hall elements located on opposite sides of the ring structure, as can be used in combination with a four-pole ring or disk magnet, for providing two differential output signals (Hall voltages) which are added before amplification.

FIG. 13 shows schematically simultaneous biasing of four Hall elements, located at equidistant positions on the ring structure, as can be used in combination with a four-pole ring or disk magnet, for providing four differential output signals (Hall voltages) which are combined into a single signal by adding two of said voltages and by subtracting therefrom the other two voltages before amplification.

FIG. 18 shows schematically the biasing and readout of a first Hall element, similar to that of FIG. 5.

FIG. 19 shows schematically the biasing and readout of the subsequent Hall element, in a manner principally different from that of FIG. 6, resulting in a modulated sampling.

FIG. 21 shows the same signals as FIG. 20, after removal of DC-offset.

FIG. 22 shows the signals of FIG. 21 after changing the sign of the odd samples.

Figure 1:
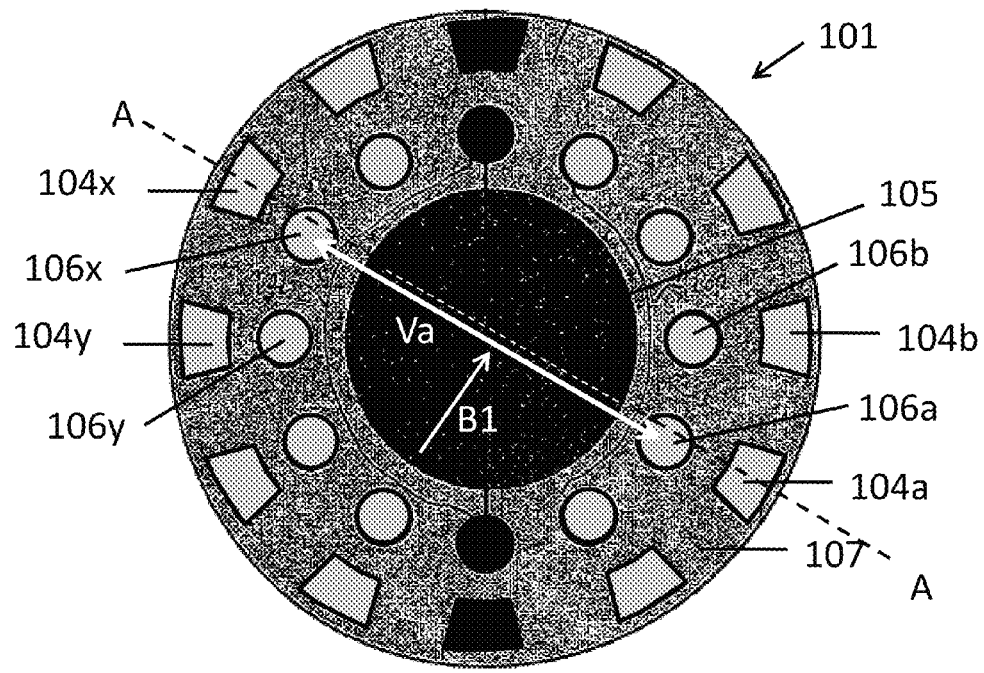
FIG. 1 shows a prior art magnetic field structure with vertical Hall elements.

The drawings are only schematic and are non-limiting. In the drawings, the size of some of the elements may be exaggerated and not drawn on scale for illustrative purposes.

Any reference signs in the claims shall not be construed as limiting the scope. In the different drawings, the same reference signs refer to the same or analogous elements.

DETAILED DESCRIPTION OF ILLUSTRATIVE EMBODIMENTS

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice of the invention.

Furthermore, the terms first, second and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the invention described herein are capable of operation in other sequences than described or illustrated herein.

Moreover, the terms top, under and the like in the description and the claims are used for descriptive purposes and not necessarily for describing relative positions. It is to be understood that the terms so used are interchangeable under appropriate circumstances and that the embodiments of the invention described herein are capable of operation in other orientations than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present invention, the only relevant components of the device are A and B.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

In the description provided herein, numerous specific details are set forth. However, it is understood that embodiments of the invention may be practiced without these specific details. In other instances, well-known methods, structures and techniques have not been shown in detail in order not to obscure an understanding of this description.

When reference is made to "external (unwanted) magnetic field", or "fremdfeld", the magnetic field other than that caused by the "magnetic source", e.g. a "permanent magnet", is meant, such as e.g. an unwanted disturbance field caused by a current running in an electrical conductor which is not intended for generating the magnetic field in the vicinity of the sensor. An example of a disturbance field is the magnetic field caused by the high currents for powering the electric motor of a hybrid vehicle.

With a magnetic source having a "rotation symmetrical" field is meant that the magnetic field looks the same after the magnetic source is rotated around its axis with a angle smaller than 360°, e.g. 180° for a four-pole ring magnet or disk magnet, or 120° for a six-pole ring magnet or disk magnet, etc.

With a uniform external field is meant a field with a constant amplitude and a constant direction. Such a field can be described as a constant vector (Bxo, Byo, Bzo).

In this document, "positive input" of a differential amplifier means the same as the "non-inverting input", and the "negative input" of a differential amplifier means the same as the "inverting input".

In this document, the terms "Hall voltage", "differential Hall voltage", "Hall potential", "differential Hall potential" and "Hall signal" are used as synonyms.

In this document, the terms "supply electrode", "supply contact" and "biasing contact" are used as synonyms.

In this document, the terms "sensing electrode", "sensing contact", "readout electrode" and "readout contact" are used as synonyms.

FIG. 1 shows a prior art structure 101 for measuring a magnetic field (not shown). As is described in detail in EP2000814(B1), this structure can be used in a magnetic angle sensor comprising a bulk substrate, a circular well 107 provided on said substrate, and an even number of electrodes 104, 106, spaced at regular intervals in a ring formation over the circular well 107, and means for selectively applying a progressive succession (or series or sequence) of differently directed bias currents to and/or using said ring of electrodes to provide a succession (or series) of Hall voltages indicative of the relative field strength in a particular direction. At the center of the well 107, a circular electrode 105 is located. In use, the contacts located on a selected diameter A-A and the structure underneath are used as a vertical Hall sensor. For example, in a first step of the biasing-and-readout sequence, a supply voltage VDD is applied to the outer electrodes 104$a$ and 104$x$, while a ground voltage GND is applied to the center contact 105, and a differential Hall voltage is measured over the electrodes 106$a$, 106$x$, representative for the magnetic field component B1 parallel to the sensor plane but perpendicular to said diameter A-A, said voltage being a first sample of a waveform obtained when cyclically biasing-and-reading out said structure. In a second step, the virtual diameter is rotated over 30°, e.g. in counter-clockwise direction (although clockwise direction could also be used), and the electrodes 104$b$, 104$y$, 105 are biased, while a second sample of the waveform is measured over the electrodes 106$b$, 106$y$. In each subsequent step, the (virtual) diameter A-A is rotated again, and additional readout values are obtained. Assuming a (two pole) bar magnet with a single North and a single South pole is present above the structure 101, the waveform of the readout signals is substantially sinusoidal, and the phase of this sinusoidal signal is indicative for the angular position of the bar magnet with respect to a predetermined (reference) position of the sensor structure 101. The reader may refer to the original document for specific details, if needed.

Figure 2:
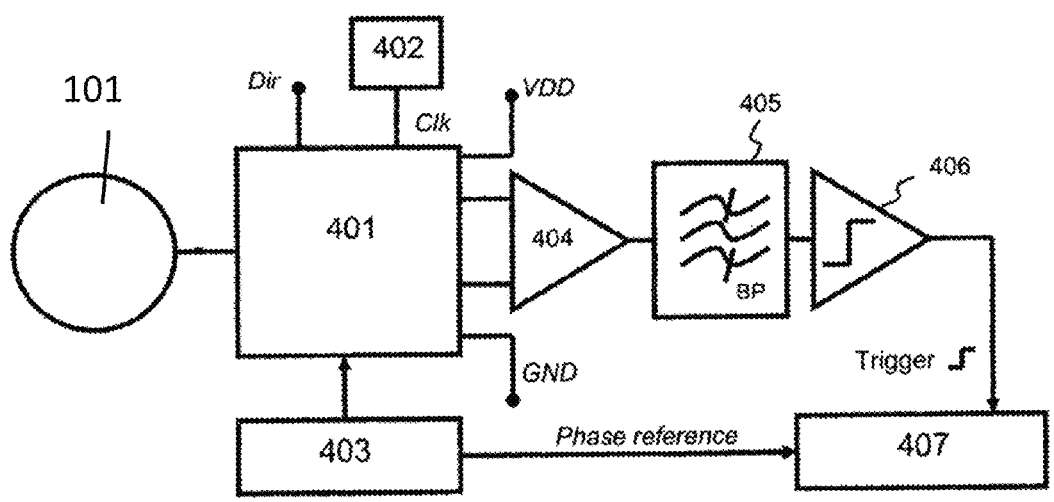
FIG. 2 shows a prior art angle determination circuit for use in combination with the magnetic field structure of FIG. 1.

FIG. 2 shows a circuit for sequentially biasing and reading-out the sensor structure, and for determining the phase difference of the magnetic field and the sensor. It contains a switching unit 401 for successively applying the biasing voltages, and reading the Hall voltages in a manner as explained above, an oscillator 402 for providing a clock signal, a six-bit-counter 403, a differential amplifier 404 for amplifying the Hall voltage, a band-pass-filter 405 for filtering away the DC-offset while smoothing the signal, a zero-crossing comparator 406 for determining when the smoothed signal passes through zero, and an output register 407 for latching a count value when that happens. This count-value is an indication for the phase of the sinusoidal signal, and hence for the angular position offset of the magnet with regard to the sensor structure. The reader may refer to the original document for specific details, if needed.

Figure 3:
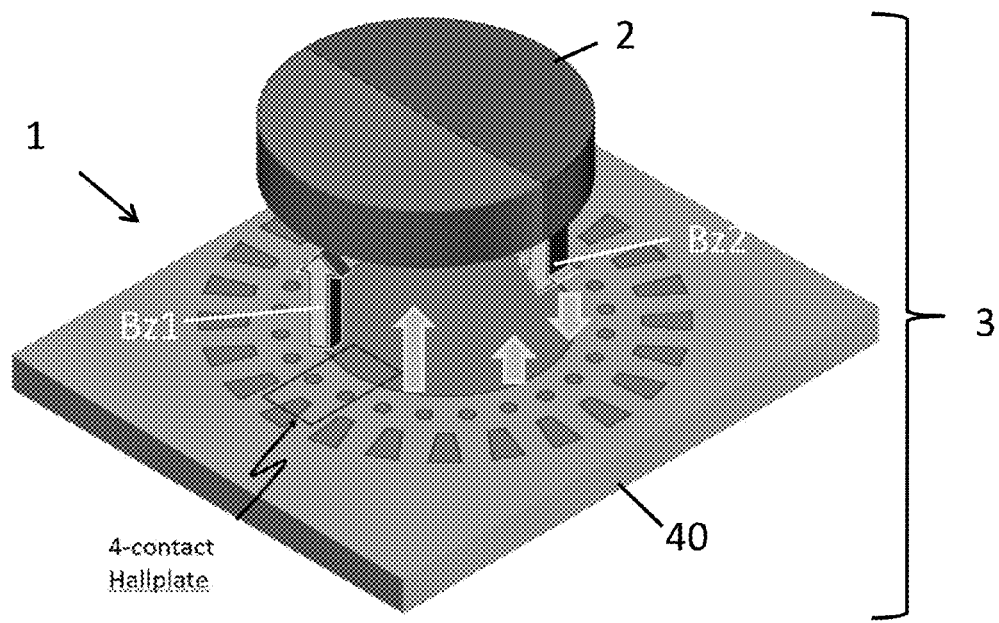
FIG. 3 shows a perspective view of an arrangement comprising a two-pole magnet, and a magnetic field sensor, according to aspects of the present invention.

FIG. 3 shows a perspective view of a magnetic field sensor structure 1 according to an aspect of the present invention. In the vicinity thereof a two-pole disk magnet 2 is shown, together forming an arrangement 3 comprising the magnet 2 and the structure 1, according to another aspect of the present invention. It should be mentioned that the present invention is not limited to arrangements 3 comprising two-pole disk magnets 2, but can also be used with a four-pole disk magnet, or a six-pole disk magnet, or a disk-magnet with more than six poles, or a two-pole ring magnet (e.g. looking very similar to the magnet shown in FIG. 3 but with a cylindrical hole in its center), or a four-pole ring magnet, or a six-pole ring magnet, or a ring magnet with more than six poles, or with other suitable kinds of magnets, such as with a two-pole bar magnet. Since the structure 1 is used for forming (or emulating, or mimicking) horizontal Hall elements, in a manner as will be explained further, and since horizontal Hall elements are only sensitive to vertical magnetic field components Bz (i.e. perpendicular to the sensor plane), a few of which components are shown at several positions of the magnet. For more information about the magnetic field of a four-pole ring-magnet, in particular the vertical field component Bz, the tangential field component Bt, and the radial field component Br, reference is made to International patent application number PCT/EP2013/067577, filed by the same applicant, on Aug. 23, 2013, in particular FIG. 7, FIG. 9 and FIG. 11 thereof, but also FIG. 13, FIG. 14 and FIG. 15 which show the field strength in function of the radius, and which are relevant for position offset errors of the magnet with regard to the sensor, or misalignment offsets of individual electrodes.

Figure 4:
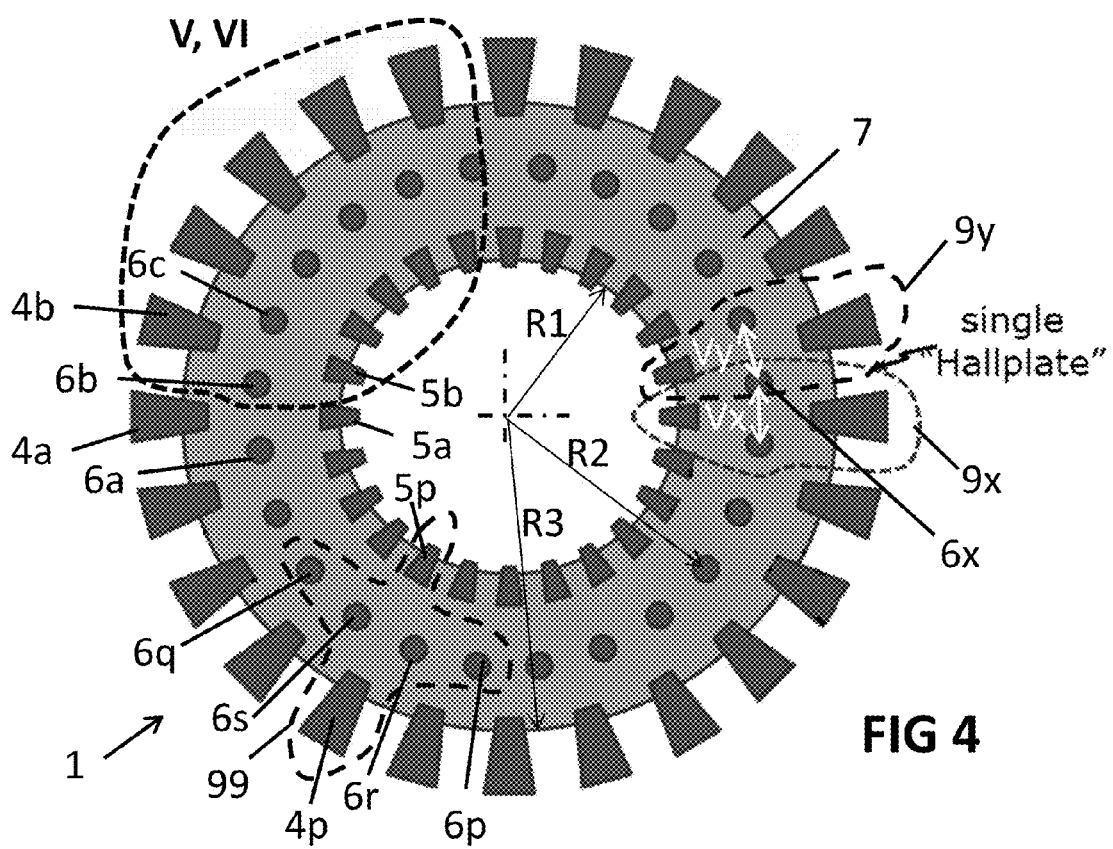
FIG. 4 shows the structure of the magnetic field sensor of FIG. 3 in top view.

FIG. 4 shows an embodiment of a magnetic field sensor structure 1 according to embodiments of the present invention, in more detail. The structure is formed on a bulk substrate 40, and comprises a circular or polygonal well 7, on top of which a number N of outer electrodes 4$a$, 4$b$, etc are formed, which are located on an outer circle with radius R3, having the same center as the well 7, and a number N of inner electrodes 5$a$, 5$b$, etc, which are located on an inner circle with radius R1 smaller than R3, and have the same angular position as the outer electrodes 4$a$, 4$b$, etc, and a number N of intermediate electrodes 6$a$, 6$b$, etc, which are located on an intermediate circle with radius R2 larger than R1 but smaller than R3. It is important to note that the intermediate electrodes 6$a$, 6$b$, etc are not located at the same angular position as the inner and outer electrodes, but are located at an angle halfway between pairs of inner and outer electrodes, as is better shown in FIG. 14. Preferably, but not necessarily the radius R2 is about equal or equal to (R1+R3)/2.

The bulk substrate may e.g. be formed of p-type material, the circular or polygonal well may be formed of n type material, the electrodes may be formed of n+ type material. In an alternative embodiment, the well 7 may be formed from p type material and the electrodes 4, 5, 6 may be formed of p+ type material. The n type embodiment is preferred as the generated signal is typically approximately three times larger due to the higher mobility of electrons as compared to holes. The shape and size of the electrodes 4, 5, 6 is not essential for the invention, and other shapes and sizes may also be used.

Each of the outer electrodes 4 can be connected to a biasing source, e.g. a current source or a voltage source, e.g. a supply voltage VDD, by means of a corresponding switch (not shown in FIG. 4) or be left floating. Likewise, each of the inner electrodes 5 can be connected to a biasing source, e.g. a current source or a voltage source, e.g. GND, by means of a corresponding switch, or be left floating. And each of the intermediate electrodes 6 may be connected to a positive input Vp of a differential amplifier 11, or to a negative input Vn of the differential amplifier 11, or be left floating by means of two corresponding switches. By selectively closing the proper switches, four electrodes: one outer electrode 4, one inner electrode (radially aligned with the outer electrode), and two (e.g. the closest) intermediate electrodes 6, can be configured to form a horizontal Hall element, whereby the outer and inner electrodes 4, 5 are used for generating a current flow in the radial direction, e.g. from the outer electrode 4 to the inner electrode 5, and whereby the intermediate electrodes 6 are used for measuring a differential Hall voltage indicative for the magnetic field strength at that location and in a vertical direction, perpendicular to the plane of the sensor 1. Two such "Hall elements" 9x, 9y are indicated in dashed line in FIG. 4. It can be seen that neighboring Hall elements 9x, 9y have one intermediate electrode 6x in common (shared), which is a very important aspect of the present invention. The main advantage hereof is that any position-offset of this intermediate electrode 6x, which may result in a somewhat larger signal Vx (Hall voltage) for Hall element 9x, will automatically result in a somewhat smaller signal Vy (Hall voltage) for Hall element 9y, thus the two Hall samples are correlated by sharing a same intermediate electrode 6x. The net result hereof is that, when the samples Vx, Vy, etc of the waveform are are processed, e.g. low-pass filtered, low-pass-filtered, or band-pass filtered, etc, the error will be largely compensated or reduced, and hence result in a negligible angular position error. This technical effect is not present in the prior art structure of FIG. 1. Indeed, if the intermediate electrode 106a would have a position offset, this would result in a value Va which is e.g. somewhat larger than it should ideally be. However, since this intermediate electrode 106a is not "shared" with other "Hall elements", it will result in a single sample having a somewhat larger value, which is not compensated by a neighboring sample having a value which is slightly smaller than it should be. The net result, after calculating the phase shift of the low-passed waveform is that it will result in an error much larger than the error obtained by the structure of the present invention. Hence, the structure 1 of the present invention has a reduced sensitivity to position errors (also referred to as misalignment errors).

It should be added that in particular embodiments of the present invention, not only one, but more than one, e.g. two or three or four, or even more Hall elements may be "activated" at the same time, meaning that their biasing electrodes 4, 5 are biased simultaneously, and that their sensing electrodes 6 are also measured simultaneously, whereby the output signals are then added (if the values all have the same sign) or subtracted (when the values have opposite signs). This will be discussed further in relation to FIG. 10 to FIG. 13. A first advantage hereof is that a larger signal amplitude is obtained from the sensor, e.g. two times, three times, or four times larger. A second advantage hereof is that it may allow a constant field to be eliminated. A third advantage hereof, especially when using a four-pole or a six-pole magnet, is that it may even allow to reduce a magnetic field gradient.

It is noted that instead of individual inner electrodes 5, the structure 1 would also work when all inner electrodes 5 would be interconnected, or would be replaced by an inner ring or disc. However, a disadvantage hereof would be that the structure consumes more power, while providing a smaller signal.

It should be noted that the structure 1 would also work when not the two intermediate electrodes 6 closest to the biasing pair are used, but when the two intermediate nodes one position further away are used, e.g. as indicated by the Horizontal Hall element 99 at the bottom of FIG. 4 (whereby the two inner intermediate electrodes are not used). This would also work, and the Hall sensors would probably have an even higher sensitivity. However, a disadvantage would be to have more noise on the signal, since the resistors of the equivalent Wheatstone bridge will be of higher value. Being more sensitive to noise, such a sensor would probably have a lower resolution.

In the rest of this document however, it is assumed that each Hall-element (also called "Hall-plate") is formed by using a biasing pair 5, 4 along with the nearest two intermediate electrodes 6, as illustrated e.g. by Hall element 9x on the right hand side of FIG. 4.

The structure of the embodiment of FIG. 4 has twenty-four (24) outer electrodes 4, twenty-four inner electrodes 5, and twenty-four intermediate electrodes 6. Since the number of inner electrodes 5 and outer electrodes 4 and intermediate electrodes 6 is the same number N, we will simply refer to this number N as "the number" of electrodes, or to "the total number" of electrodes 4, 5, 6 when their sum is meant. The invention is however not limited to structures 1 with N=24, and other numbers of N smaller than twenty-four, such as e.g. 8, 12, 16, or 20 or larger than twenty-four, such as e.g. 30, 32, 36, 48, 64, or even larger than 64 can also be used. It is noted that the invention would even work with an odd number of electrodes, for example N=15. The smallest possible number for N is probably three, but as explained above, due to the relatively large distance between the biasing contacts 4, 5 and readout contacts 6, and the resulting increase in noise and decrease in resolution due to this large distance, a practical lower limit is probably at least six, or at least eight.

The skilled person can make a trade-off when selecting the number of N. When the number of N is reduced, less switches are required (simpler hardware, simpler control), and the faster a complete cycle is finished (at a given clock rate), but the less samples (per period) are taken to "sample" the sinusoid, thus the lower the resolution, and the lower the accuracy to be expected. When the number of N is increased, more switches are required (more complex hardware, more complex control), and the slower a complete cycle is finished (at a given clock rate), but the more samples are taken to "sample" the sinusoid, thus the higher the resolution, and the higher the accuracy to be expected, although there is a practical limit where the accuracy will not increase anymore, e.g. because of process tolerances, and/or layout tolerances, and/or magnet tolerances, or where the cycle time would become impractical, or the counters would become excessively large. This practical limit may depend on the process technology, the specific type of magnet being used, etc. In practice therefore the number N is preferably chosen in the range of 8 to 256, preferably in the range of 8 to 128, more preferably in the range of 8 to 64. In preferred embodiments N is a power of 2, for example 8, 16, 32 or 64 or 128 or 256.

FIG. 5 and FIG. 6 will illustrate two consecutive steps of a first readout technique referred to herein as the "un-modulated" readout technique. A second readout-technique referred to as a the modulated readout technique will be described later, in relation to FIG. 18 and FIG. 19.

FIG. 5 shows part of the structure of FIG. 4 in enlarged view, and in a first biasing situation, e.g. by connecting electrode 5b to the supply voltage VDD, and by connecting electrode 4b to ground voltage GND, and by connecting readout electrode 6b located on the left of the biasing pair 5b, 4b as seen from the center of the structure 1 to the positive input Vp of the differential amplifier, and by connecting readout electrode 6c located on the right of the biasing pair 5b, 4b as seen from the center of the structure 1 to the negative input Vn of the differential amplifier, 11, to read a first Hall voltage, which is a first sample of the sinusoidal waveform to be measured. In case this is the only Hall element which is "activated", i.e. if no other Hall elements are biased and readout simultaneously, all other electrodes are left "floating".

FIG. 6 shows the same part of the structure 1 as shown in FIG. 5, but in a subsequent biasing situation (assuming the Hall elements are biased and readout in a clockwise manner), wherein electrode 5c is connected to the supply voltage VDD, electrode 4c is connected to ground voltage GND, readout electrode 6c located on the left of the biasing pair 5c, 4c as seen from the center of the structure 1 is connected to the positive input Vp of the differential amplifier 11, and readout electrode 6d located on the right of the biasing pair 5c, 4c as seen from the center of the structure 1 is connected to the negative input Vn of the differential amplifier 11, to read a second Hall voltage, which is a second sample of the sinusoidal waveform to be measured. In a third and every following step, the next and each subsequent Hall element would be "biased" and "measured" in a similar manner, by each time connecting the electrode "on the left" to the positive input, and the electrode "on the right" to the negative input of the amplifier. By comparing FIG. 5 and FIG. 6, it can be seen that intermediate electrode 6c is connected to the negative input Vn of the amplifier 11 in a first step, and to the positive input Vp of the amplifier 11 in another step, and that the biasing current in FIG. 5 and FIG. 6 is always flowing in the same radial direction, e.g. outwardly. This also means that one switch is required for each outer electrode 4, one switch is required for each inner electrode 5, and two switches are required for each intermediate electrode 6 for performing this "unmodulated biasing-and-readout technique".

Of course, it is also possible to cycle the Hall elements in a counter-clockwise-direction, which would result in waveform and an angular offset measured in the opposite direction. To avoid confusion, in the rest of this document, it is assumed that the cycling is always performed in a clockwise direction, unless specifically mentioned otherwise.

FIG. 7 shows an example of a schematic block-diagram of a biasing-and-readout circuit 10 adapted for performing the unmodulated biasing-and-readout method described above, using the structure 1 of FIG. 4. The biasing-and-readout circuit 10 has a control block 19, for controlling (i.e. opening and closing) the switches for selectively biasing the inner and outer biasing electrodes 5, 4, and for selectively connecting the intermediate readout electrodes 6 to the inputs of the amplifier 11. The control block 19 may comprise one or more shift registers with a "walking one", as will be explained further, in relation to FIG. 10 to FIG. 13. The differential Hall voltage is amplified by the amplifier 11, e.g. an instrumentation amplifier for further processing. The circuit of FIG. 7 also includes a buffer 13, which is optional, and can be used e.g. in a test-chip for bringing the amplified signal to the outside, for measurement. However, when an angle determination circuit is also present on the same chip, as will be discussed in relation to FIG. 24, the buffer 13 may be omitted.

In an embodiment, the part of the circuit of FIG. 2, comprising the Band-Pass-Filter 405, the zero-crossing comparator 406, the counter 403, and the output register 407, can be added to the biasing-and-readout circuit 10 of FIG. 7, as an example of an angle determination circuit, thereby forming a complete circuit of a angle sensor device. Of course the counter 403 may have more than six bits. An advantage of using a band-pass-filter instead of a low-pass-filter is that the DC-component, due to offset errors of the amplifier, is eliminated. This circuit measures the phase difference φ between the measured waveform 21 and the reference waveform by means of a number of clock counts, but other methods and circuitry for determining the phase difference may also be used.

Figure 8:
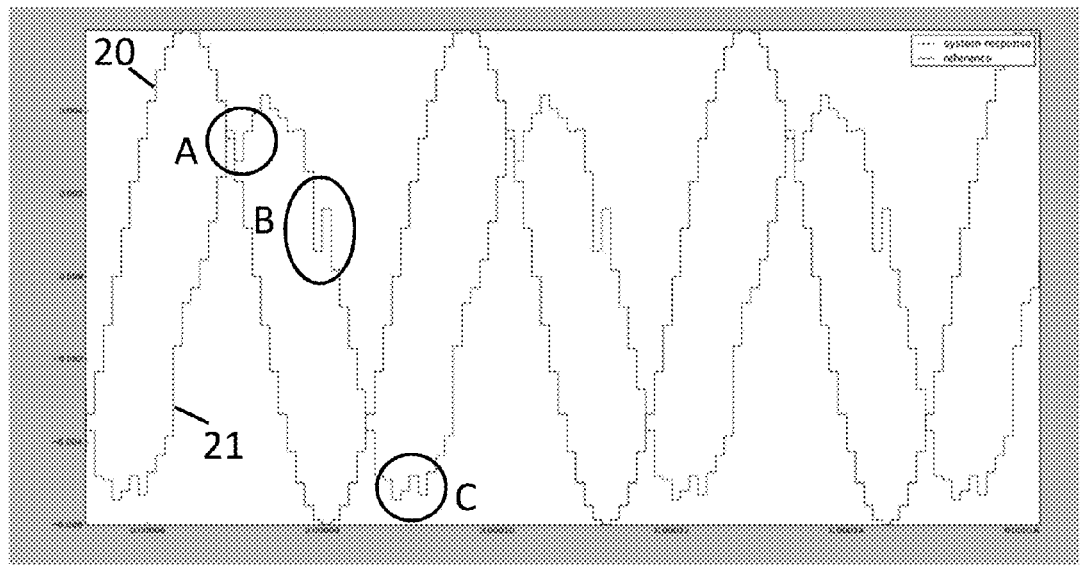
FIG. 8 shows a plot of an ideal output waveform, and a simulated waveform as can be obtained from a structure like that of FIG. 4 but with some imperfections.

FIG. 8 shows a plot of an ideal output waveform 20, which is a stepwise approximation of a sinusoidal signal, and a simulated waveform 21 as can be obtained from a biasing-and-readout circuit 10 of FIG. 7 connected to the structure 1 of FIG. 4, using the so called un-modulated biasing-and-readout technique which was discussed in relation to FIG. 5 and FIG. 6. The simulated waveform is based on a structure 1 having some imperfections, such as e.g. a misalignment or position offset of one or more of the inner/outer/intermediate electrodes 5, 4, 6, doping gradient, local imperfections due to CMOS technology, and even stress effects. As discussed above, when one sample (Hall voltage) is slightly larger than the value it should be, the subsequent sample is slightly smaller than the value it should be, because neighboring Hall elements use the same intermediate electrode 6, as is indicated by the letters A, B and C in FIG. 8. As illustrated, these errors appear as very high frequency disturbances, which can easily be filtered out, and have no noticeable influence on the low-passed waveform.

Figure 9:
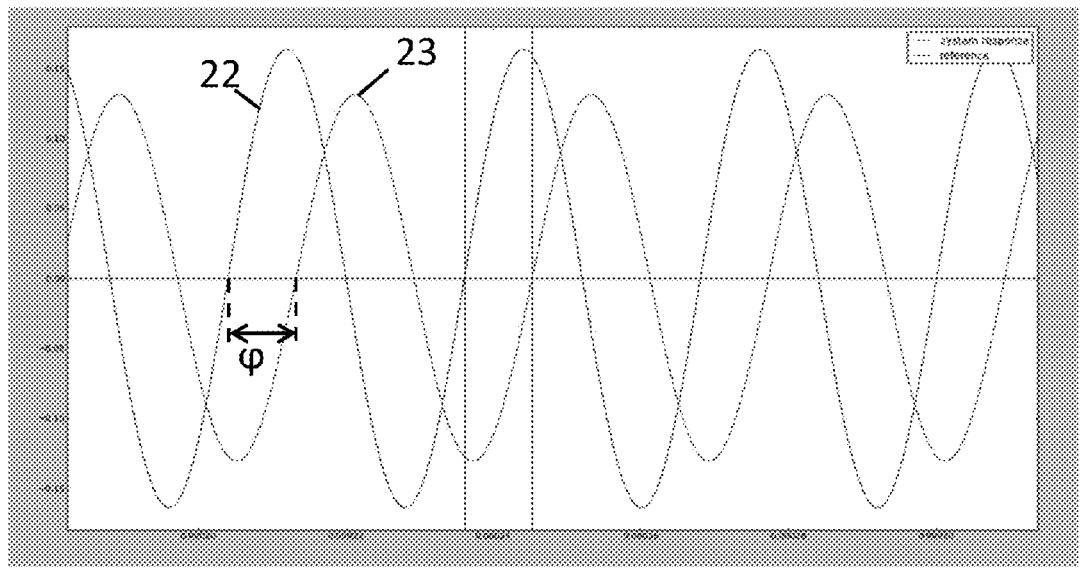
FIG. 9 shows a plot of the waveforms of FIG. 8 after low-pass filtering.

FIG. 9 shows a plot of the waveforms of FIG. 8 after low-pass filtering or band-pass filtering. Such a filter is not shown in the block-diagram of FIG. 7, but will be discussed as part of the angle determination circuit shown in FIG. 24. It is the aim of the angle determination circuit to determine the phase shift φ between the measured signal 23 and a reference signal 22.

FIG. 10 to FIG. 13 show examples of several possible ways of biasing the structure of FIG. 4, but the invention is not limited to these examples, and other ways of biasing the structure are also possible. These four figures only show the circuit and switches for biasing the outer electrodes 4 of the structure 1, the interconnections and switches to the inner and intermediate electrodes 5, 6 are omitted for not obscuring the drawings. As each outer electrode 4 corresponds to one Hall element, the reference 9 is used in these figures.

Figure 10:
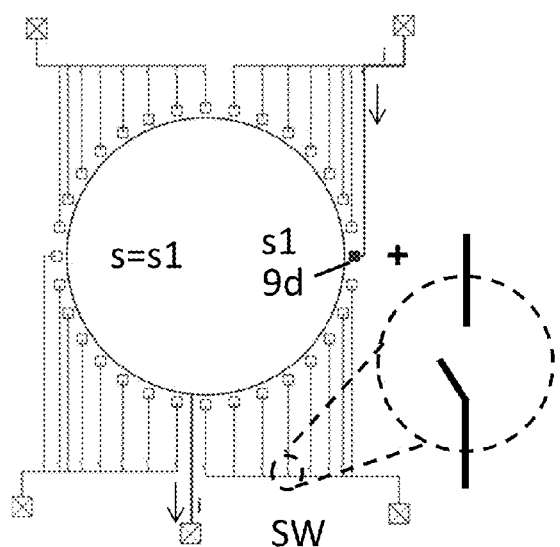
FIG. 10 to FIG. 13 show examples of several but not all possible ways of biasing the structure of FIG. 4. These four figures are only a schematic view, as only the outer electrodes are shown, but not the inner biasing electrodes or the readout electrodes, for illustrative purposes.

FIG. 10 shows schematically one step of a biasing method in which a single Hall element (indicated in black) is biased, as was discussed in relation to FIG. 5. It is an advantage of this biasing-and-readout method that it can be used with structures 1 of FIG. 4 having any number N of electrodes, which can be even number or an odd number. If each Hall element is consecutively biased and sensed, the number of steps to complete a full cycle is equal to the number N of Hall elements. This biasing method may be used in conjunction with a two-pole magnet, or a four pole magnet, or a six-pole magnet, or a magnet with more than six poles. The signal s to be amplified is equal to the signal s1 obtained from the Hall element being biased (e.g. element 9d in the first step of the sequence). Although not clearly visible, each vertical interconnection line contains a switch, one of which is shown enlarged.

Figure 11:
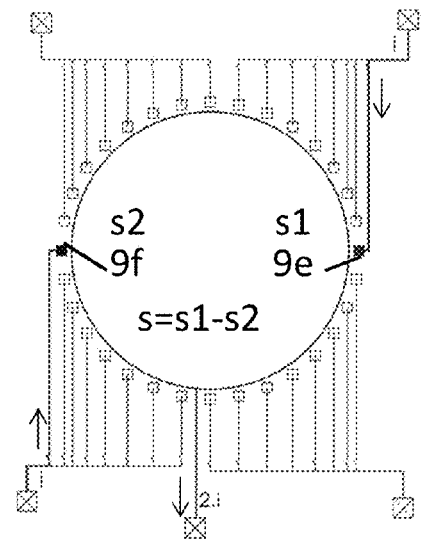

FIG. 11 shows schematically one step of a biasing method in which two Hall elements are simultaneously biased and readout. The Hall elements which are simultaneously biased are located on opposite sides of the ring structure, hence the number N of electrodes must be even in this case. If biased in this way, the structure 1 will provide two differential Hall voltages, which in this example are subtracted from each other, before being amplified. A typical example where this biasing-method can be advantageously used is shown in FIG. 3, where the vertical field components Bz1 and Bz2 of a two-pole magnet 2 are simultaneously measured, and their values (having an opposite sign) are subtracted, thus their absolute values are added, resulting in a larger signal. Moreover, by subtracting the two measured values, any constant (unwanted) external field component (fremdfeld) is canceled. The signal s to be amplified is equal to the signal s1-s2, where s1 is obtained from one Hall element being biased, and s2 is obtained from the other Hall element being biased. It is noted that there exist operational amplifier implementations having two differential inputs for achieving both adding or subtraction, and amplification.

Figure 12:
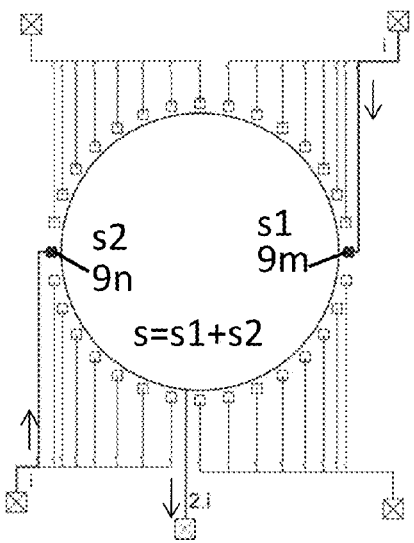

FIG. 12 shows schematically one step of a biasing method in which also two Hall elements are simultaneously biased and readout. The Hall elements which are simultaneously biased are also located on opposite sides of the ring structure, and the number N of electrodes must also be even in this case. However, in this case the two values are added to each other. A typical example where this biasing-method can be used is a variant of FIG. 3 wherein the two-pole magnet 2 is replaced by a four-pole magnet (see e.g. FIG. 28), in which case the vertical field components Bz1 and Bz3 would have substantially the same value (and the same sign), thus again their absolute values are added, resulting in a larger signal. This method is however not robust against a constant external field. The signal s to be amplified is equal to the signal s1+s2, where s1 is obtained from one Hall element being biased, and s2 is obtained from the other Hall element being biased. It is noted that the operational amplifier implementation mentioned above having two differential inputs can be used also here.

Figure 13:
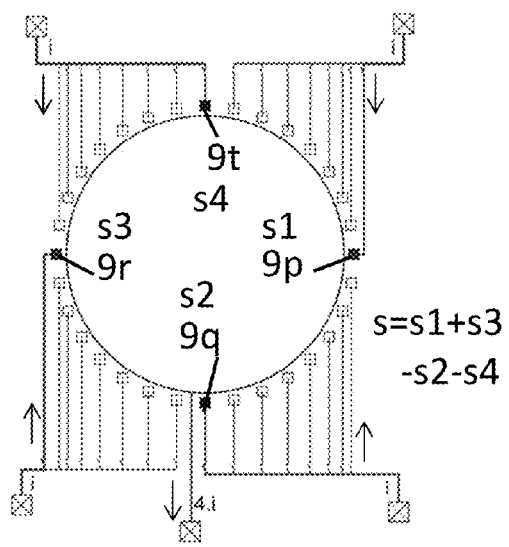

FIG. 13 shows schematically one step of a biasing method in which four Hall elements are simultaneously biased and readout. This method can be applied if the number N of electrodes is an integer multiple of four. The Hall elements which are simultaneously biased are located at equidistant positions on the ring structure. In this case two values s1 and s3 are added, while two other values s2 and s4 are subtracted. A typical example where this biasing-method can be used is a variant of FIG. 3 wherein the two-pole magnet 2 is replaced by a four-pole magnet (see e.g. FIG. 28), in which case the vertical field components Bz1 and Bz3 would have substantially the same value (and the same sign), while the vertical field components Bz2 and Bz4 have the same amplitude but opposite sign. Thus by calculating the total signal s as s1+s3-s2-s4, a signal is obtained which is four times larger than a single signal s1. Since two values are added, and two values are subtracted, a constant (unwanted) external field component would be canceled out in the total signal. This biasing-and-readout method is thus also robust against a constant external field.

It is noted that other biasing-and-readout methods are also possible, for example for simultaneously reading three Hall elements, located at 120° angular distances. Such a method is similar to the one of FIG. 12, and can be used e.g. with a six-pole ring or disk magnet, but would not be robust against a constant external field.

In a variant of the readout method of FIG. 13, a six-pole magnetic field would be measured by biasing and-reading six hall elements simultaneously, each being 60° shifted with respect to the other, in manner similar to FIG. 13, and the total signal would be calculated as s=s1+s3+s5−s2−s4−S6, then the total signal obtained from the structure would be six times larger than that obtained by a single Hall sensor, and the measurement would be robust against a constant external field ("Fremdfeld"). It is noted in this particular case, that also the field gradient of an external disturbance field may be reduced.

In each of the FIG. 10 to FIG. 13 above, only one step of the cycle is shown, resulting only in a single sample of the waveform to be measured. Of course, in the next step of the cycle the neighboring Hall elements, either clockwise or counterclockwise are to be biased and readout, etc.

It is noted that the examples of FIG. 10 to FIG. 13 and the additional examples described here above are only examples, and which method to be used depends a.o. on the number of electrodes N of the structure 1, and on the magnet 2 being used. The skilled person can choose any suitable method.

Figure 14:
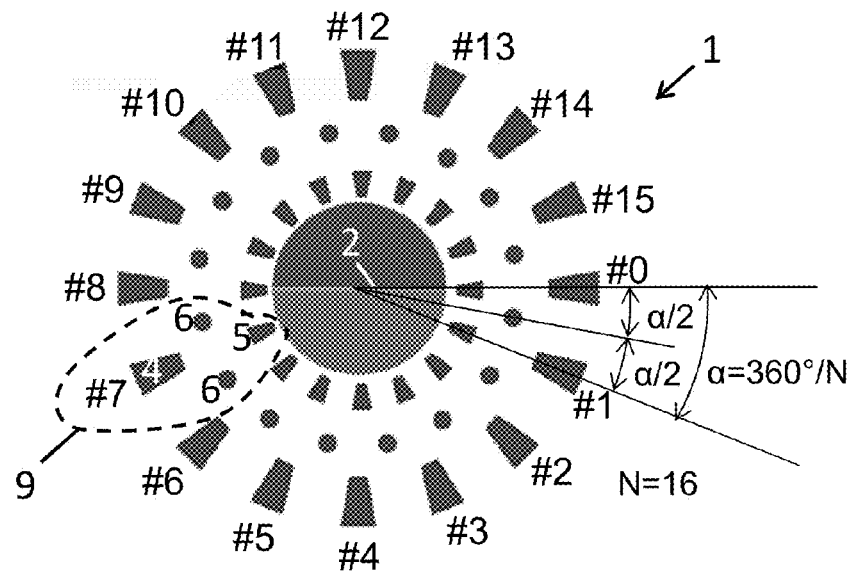
FIG. 14 shows a structure similar to that of FIG. 4, but having 16 inner electrodes and 16 outer electrodes for forming 16 biasing pairs (instead of 24 in FIG. 4), and 16 intermediate electrodes for forming 16 horizontal Hall plates. In the center of the figure also the orientation of a two-pole magnet is shown to indicate the zero-angle position, but the magnet is not part of the structure.

FIG. 14 shows a structure 1 similar to that of FIG. 4, but having sixteen (16) inner electrodes 5 and sixteen outer electrodes 4 and sixteen intermediate electrodes 6 for forming sixteen "horizontal Hall plates", one of which is indicated by reference 9. In the center of FIG. 14 also the orientation of a two-pole magnet 2 (which would be arranged above the sensor, as illustrated in FIG. 3) is shown for illustrative purposes, to indicate the "zero-angle position", but the magnet 2 is not part of the structure 1. This figure also clearly shows that the inner electrodes 5 are located in the same angular position as the outer electrodes 4, and the electrodes of neighboring Hall elements are located apart at an angular distance α=360°/N, N being the number of inner electrodes, while the intermediate electrodes 6 are located at an angular distance of α/2=180°/N from the inner and outer electrodes. It is an advantage of choosing the two readout-electrodes 6 in this manner, because it allows "sharing" of each intermediate electrode 6 by two neighboring Hall elements. This requires less contacts, and thus less switches, and a less complex control logic as compared to the case where two dedicated readout-electrodes would be used per Hall element 9.

Figure 15:
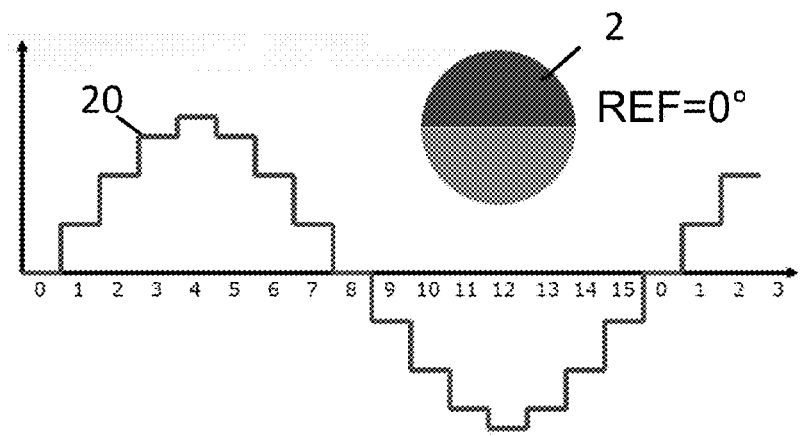
FIG. 15 shows an ideal waveform as would be obtained by an ideal (without offsets, or other imperfections) structure according to FIG. 14, when the two-pole disk magnet is oriented at an angle of 0°, when the Hall elements of the structure are successively biased and readout. This signal is used as the reference signal for indicating zero angular position. This is also the waveform that would be obtained from a perfect structure and a perfect angle determination circuit, apart from a multiplication factor due to the gain of the amplifier, which is assumed to be equal to 1.0 in this and the following figures, for illustrative purposes.

FIG. 15 shows an ideal waveform 20 as would be obtained from an ideal structure 1 of FIG. 14 (e.g. having a perfect geometry, and made by a perfect CMOS process) and an ideal biasing-and-readout circuit 10 (e.g. having an amplifier with no DC-offset), when the two-pole disk magnet 2 is oriented at an angle of 0°. This signal is used as the reference signal for indicating a zero angular position of the magnetic field.

Figure 16:
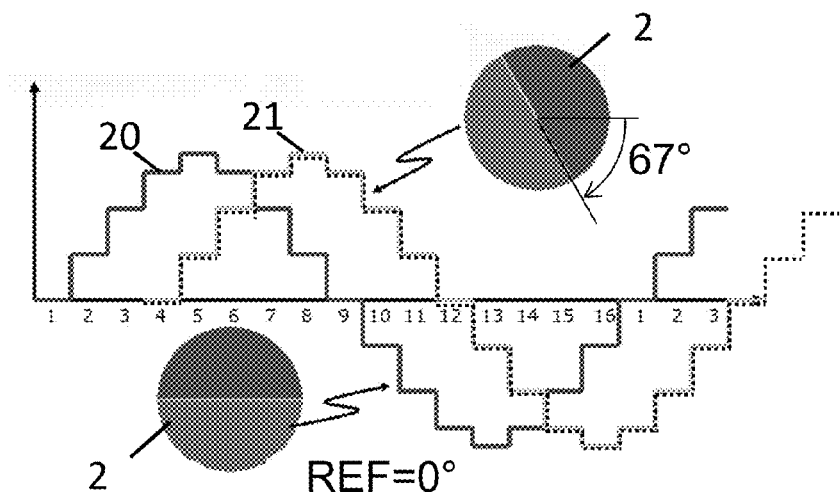
FIG. 16 shows the reference waveform and the measured waveform as would be obtained by the sixteen horizontal Hall plates of FIG. 14, when the two-pole disk magnet is oriented at an angle of about 67°. It shows that the measured signal is phase-shifted over about 67° (or about 3 of the 16 samples) in clockwise direction.

FIG. 16 shows the reference waveform 20 and the measured waveform 21 as would be obtained from the sixteen horizontal Hall plates of FIG. 14, when using the biasing and readout method of FIG. 10 (wherein each Hall element is biased and readout separately), in the case where the two-pole disk magnet 2 is oriented at an angle of about 67° with regard to the reference position.

Figure 17:
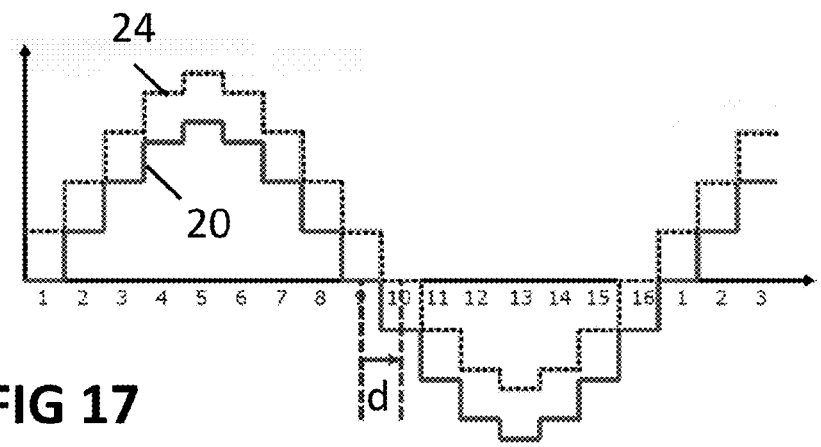
FIG. 17 shows the output waveform as would be obtained from the sensor of FIG. 14, when the two-pole disk magnet is oriented at an angle of 0°, but when the differential amplifier of the biasing and readout circuit has an (unwanted) DC offset.

FIG. 17 shows the waveform 24 as would be obtained from the sensor of FIG. 14, when the two-pole disk magnet 2 is oriented at an angle of 0°, but when the differential amplifier 11 of the biasing and readout circuit 10 has an (unwanted) DC offset. It is clear that if such offset is not canceled or compensated for, it will provide a value for the zero-crossing, which will appear as a rotation error. (In fact, the zero-crossing is typically not measured on the staircase signals shown, but on a low-pass or band-pass filtered version thereof, but the effect is the same).

Figure 18:
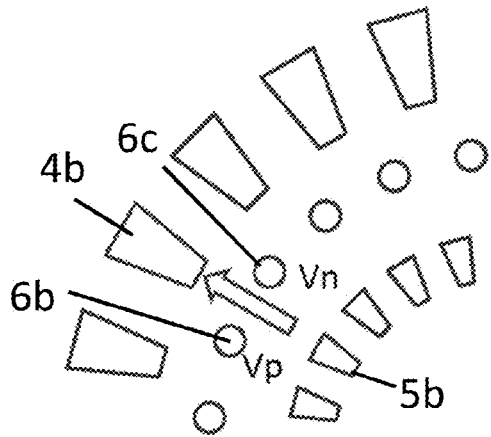
FIG. 18 and FIG. 19 illustrate a second readout technique, referred to herein as "modulated readout technique".
Figure 19:
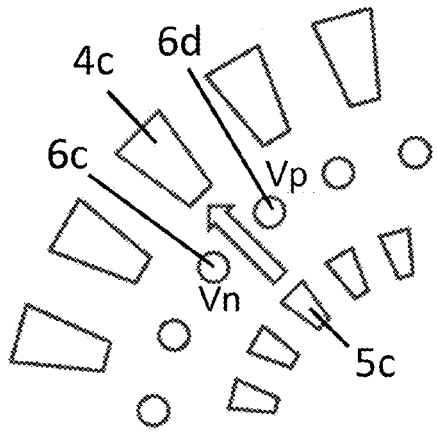

FIG. 18 and FIG. 19 will illustrate two consecutive steps of a second readout technique referred to herein as the "modulated" readout technique, in which the structure 1 of the present invention can be biased and read-out. The reader is reminded that FIG. 5 and FIG. 6 illustrated the "un-modulated" readout technique.

FIG. 18 shows schematically the biasing and readout of a first Hall element comprising the electrodes 5b, 4b, 6b and 6c, in a manner identical to that of FIG. 5, whereby intermediate electrode 6b located on the "left" of the biasing electrodes 5b, 4b as seen from the center is connected to the positive input Vp of the differential amplifier 11, and the intermediate electrode 6c located on the "right" of the biasing electrodes 5b, 4b as seen from the center is connected to the negative input Vn of the differential amplifier 11.

FIG. 19 shows schematically the biasing and readout of the subsequent Hall element, in a manner which is principally different from that of FIG. 6, because for this Hall element the intermediate electrode 6c located on the "left" of the biasing electrodes 5c, 4c, as seen from the center is not connected to the positive input Vp (as was the case in FIG. 6), but is connected to the negative input Vn of the differential amplifier 11, and the intermediate electrode 6d located on the "right" of the biasing electrodes 5c, 4c, as seen from the center is not connected to the negative input Vn (as was the case in FIG. 6), but is connected to the positive input Vp of the amplifier 11. When comparing FIG. 18 and FIG. 19, it can be seen that the electrode 6c is connected to Vn in both cases. This "modulation" can thus simply be achieved by proper switching of the intermediate electrodes 6. The effect of this second manner of biasing-and-readout is illustrated in FIG. 20.

Figure 20:
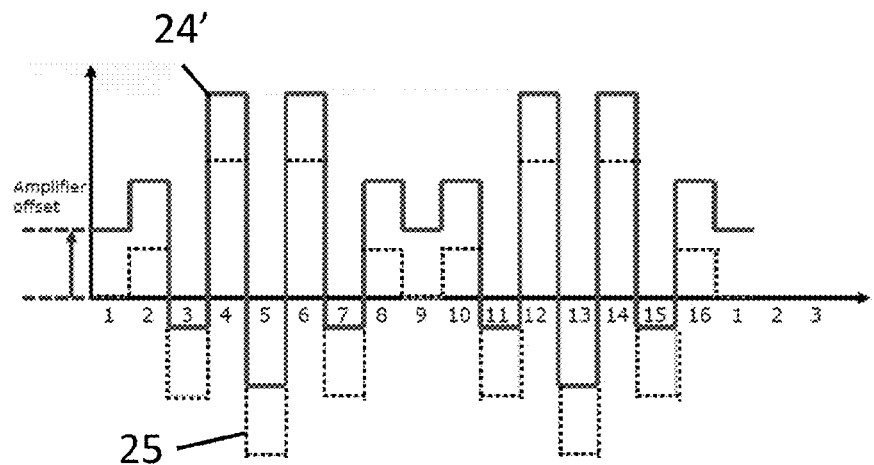
FIG. 20 shows the measured signal obtained by the structure of FIG. 14, when the two-pole magnet is at 0° phase shift, but with a non-zero amplifier offset, and using the modulation shown in FIG. 18 and FIG. 19. The thick line shows the waveform at the output of the amplifier, the dotted line shows the waveform after DC-offset-correction.

Referring to FIG. 20, the waveform 24' is the waveform at the output of the amplifier 11, using the "modulated" biasing-and-readout technique illustrated in FIG. 18 and FIG. 19. This waveform looks the same as waveform 20 of FIG. 16, after changing the sign of each odd numbered sample, and after addition of a DC-offset to each sample (due to the amplifier offset). The waveform 25 shows the signal that would be obtained if the DC-offset of the amplifier were zero.

Figure 21:
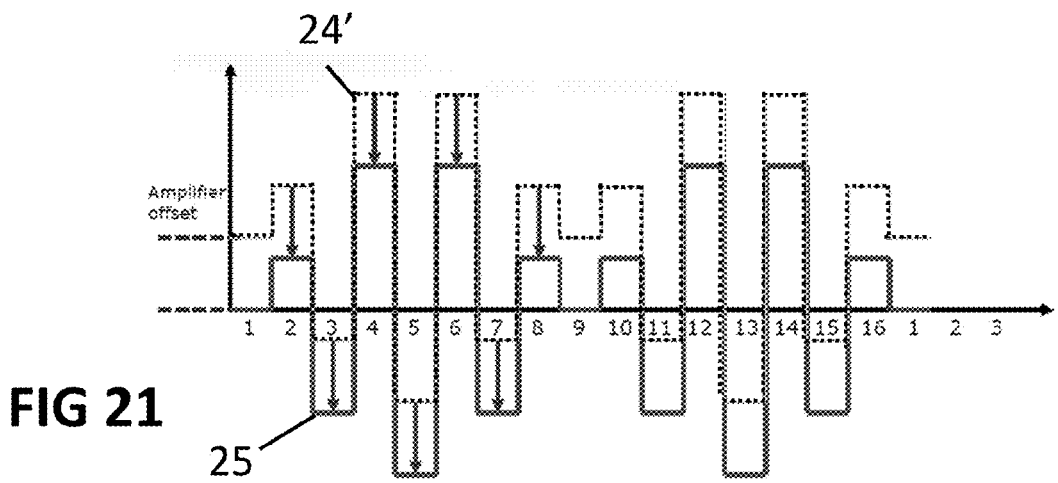
FIG. 21 and FIG. 22 show two steps of a possible demodulator implementation.
Figure 22:
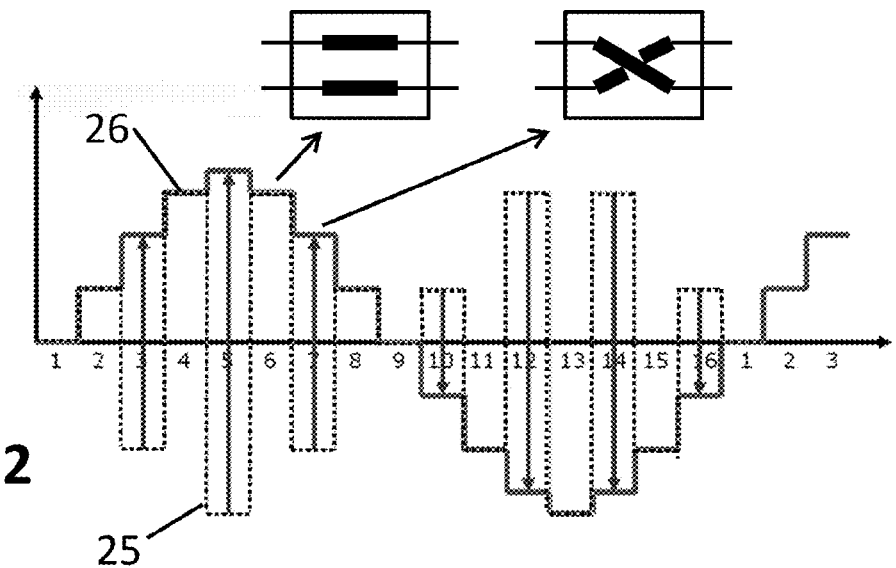

FIG. 21 in combination with FIG. 22 show the step of "demodulation", using a demodulator 16 (see block-diagram of FIG. 24), resulting in removal of the amplifier DC-offset (FIG. 21) and inversion of the sign of the odd numbered samples (FIG. 22). A possible embodiment for removing the DC-component (FIG. 21) is an analog band-pass-filter, but other devices or techniques may also be used, for example a so called "peak-to-peak detector", which is a component in the family of switched capacitor filters. Such a filter would calculate the difference between subsequent samples. Assuming the waveform 24' contains the samples s[1], s[2], s[3], etc, this filter would provide at its output: s[2]−s[1], s[3]−s[2], s[4]−s[3], etc, which corresponds to the signal 25 of FIG. 20 and hence is free of the DC component. One possible implementation for "inversing the sign" of the odd numbered samples is by simply "passing" the differential signals for even numbered samples (as shown in FIG. 22 for sample #6), and by "swapping" the two signal lines for odd numbered samples (as shown in FIG. 22 for sample #7). This function can be implemented by a "pass-or-swap block" 41 which can be built e.g. by means of a few switches, and may optionally include a sample and hold buffer to avoid glitches. But the invention is not limited to such demodulators, and any other suitable demodulator known by the skilled person, analog or digital, may also be used.

FIG. 22 shows the signal 26, derived from the signal 24' after demodulation.

Figure 23:
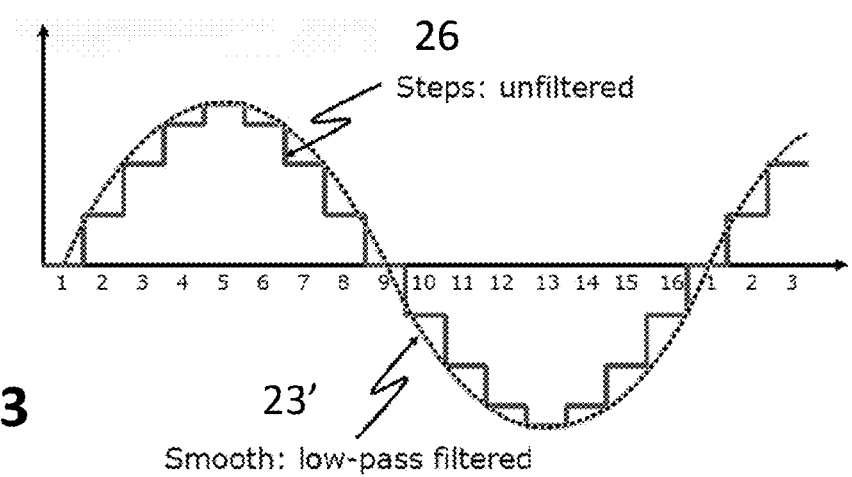
FIG. 23 shows the demodulated signal of FIG. 22 after low-pass filtering.

FIG. 23 shows the signal 23', after low-pass-filtering the signal 26 of FIG. 22. (the filtered signal is shown slightly separate from the staircase function, for illustrative purposes).

Figure 24:
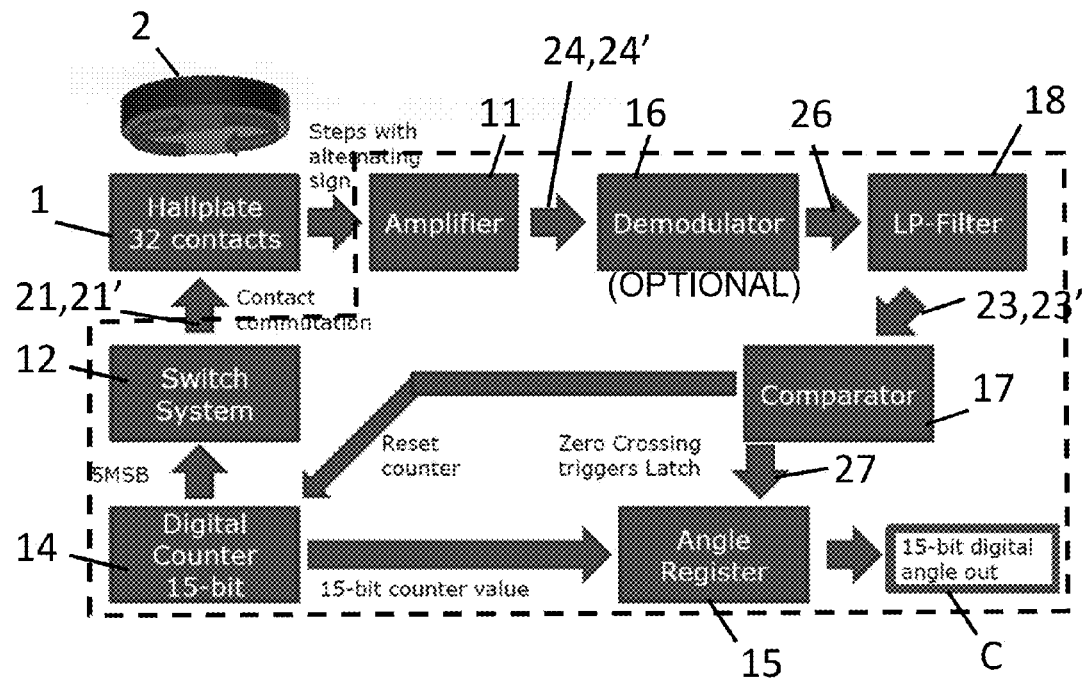
FIG. 24 shows an embodiment of a combination circuit comprising a biasing and readout circuit for biasing the Hall-plate structure as in FIG. 4 or FIG. 14, and for readout and amplification of the Hall voltages, and an angle determination circuit for determining the angular position of a magnetic field in the vicinity of the Hall-plate structure.

FIG. 24 shows an embodiment of a circuit comprising both a biasing and readout circuit 10 for selectively and repetitively biasing the Hall-plate structure 1 and for reading out the corresponding Hall voltages for obtaining samples of a waveform, and an angle determination circuit for determining the angular position of the magnetic field by determining a phase shift φ of said measured waveform with respect to a reference waveform, as illustrated in FIG. 9. When the switch system 12 uses the "un-modulated readout-technique" illustrated in FIG. 5 and FIG. 6, the demodulator block 16 can be omitted. When the switch system 12 uses the "modulated readout-technique", the demodulator block 16 is required, but less switches can be used for connecting the intermediate electrodes 6 to the amplifier 11. The main advantage of using the "modulated readout technique" versus the "un-modulated readout technique" is the following: The modulated readout technique allows to combine Hall sensor offset and amplifier offset in the DC domain together and to eliminate them by the following signal demodulation and low-pass filtering in two simple steps. Therefore this architecture does not require for complex building blocks or filter structures. A typical amplifier gain lies in the range of 100 to 1000.

Figure 25:
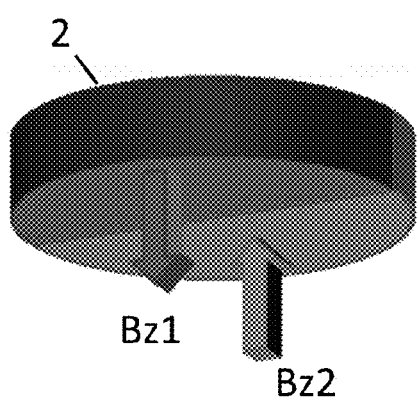
FIG. 25 shows the magnetic field Bz components of a two-pole disk magnet, perpendicular to the sensor plane.

FIG. 25 shows the strength of the magnetic field components Bz1 and Bz2 in a direction perpendicular to the plane of a two-pole disk magnet (or a magnetic sensor located in a parallel plane and at a distance therefrom). These field components Bz1, Bz2 can be measured by horizontal Hall elements located in such a sensor plane.

Figure 26:
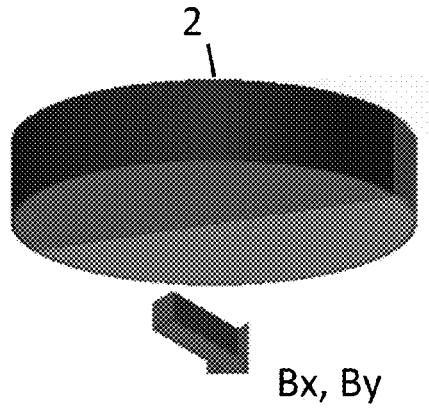
FIG. 26 shows the magnetic field component in a plane parallel to the sensor, which can be measured when using a sensor as described above, plus an integrated magnetic concentrator (IMC) mounted thereon.

FIG. 26 shows the magnetic field component Bx, By in a direction parallel to the plane of a two-pole disk magnet (or a magnetic sensor located in a parallel plane and at a distance therefrom). These field components Bx, By can normally not be measured by horizontal Hall elements located in such a sensor plane.

Figure 27:
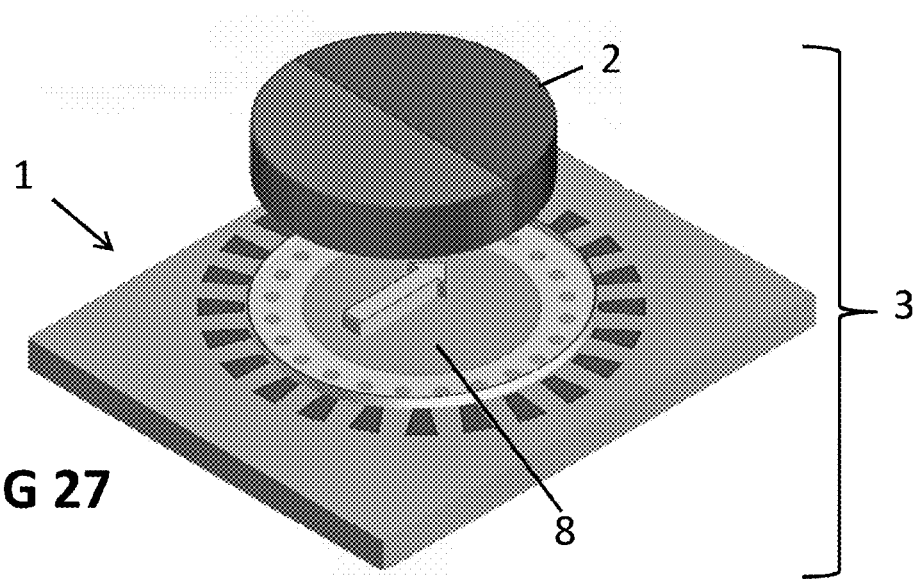
FIG. 27 shows a variant of the arrangement of FIG. 3, whereby the sensor comprises an integrated magnetic concentrator (IMC).

However, if a so called integrated magnetic field concentrator 8 is added on top of the structure 1, the magnetic field lines Bx and By will be bent into a direction substantially perpendicular to the sensor plane, such that they can actually be measured by horizontal Hall elements 9. FIG. 27 shows a variant of the arrangement of FIG. 3, whereby the structure 1 comprises such an integrated magnetic concentrator (IMC) 8, having a disk shape of a predetermined thickness and diameter. More information about IMC can be read e.g. in US20020021124. It is an advantage of using a horizontal Hall element in combination with IMC 8, that the IMC 8 provides for a signal amplification in a passive way. Hence, the magnetic concentrator 8 functions as a passive magnetic amplifier and improves sensor performance. The dimensions, in particular the thickness and diameter of the IMC 8 should be made such that on one hand they give a good, e.g. an improved, e.g. the highest, gain on the Hall devices, but on the other hand there must not be saturation effects from the magnetic field bringing non-linearity. Suitable dimensions can be determined by routine tests, or by trial and error.

Figure 28:
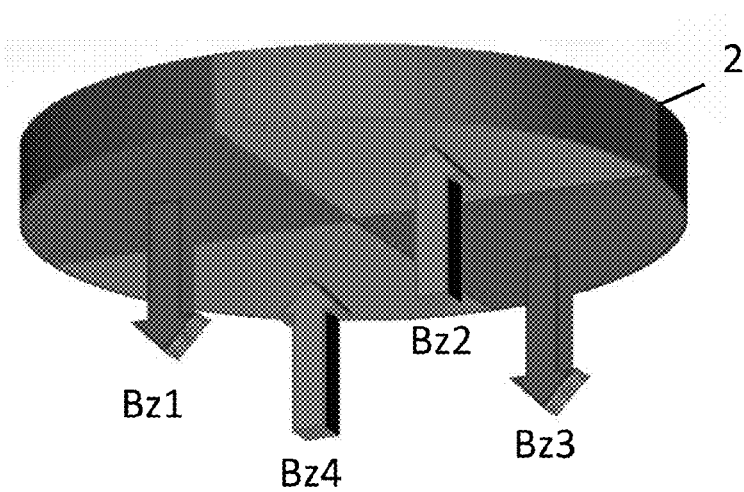
FIG. 28 shows the vertical field at four locations of a four-pole disk magnet as can be used in embodiments of the present invention.

FIG. 28 shows the vertical field at four locations of a four-pole disk magnet 2 as can be used in embodiments of the present invention. In case the biasing-method shown in FIG. 12 is used for measuring the angular position of this magnet above the structure 1 (not shown), the components Bz3 and Bz1 are measured simultaneously and the resulting measured signals s1 and s3 are added in a particular step of the sequence. At another moment in time, the components Bz2 and Bz4 are measured simultaneously and the resulting measured signals s2 and s4 are added.

In case the biasing-method shown in FIG. 13 is used for measuring the angular position of this magnet above the structure 1 (not shown), all four components Bz1, Bz2, Bz3 and Bz4 would be measured simultaneously in each step of the sequence, and the resulting measured signals s1, s2, s3 and s4 are added and subtracted according to the formula: s=s1+s3−s2−s4, which has an amplitude about four times that of each of the signals separately.

Figure 29:
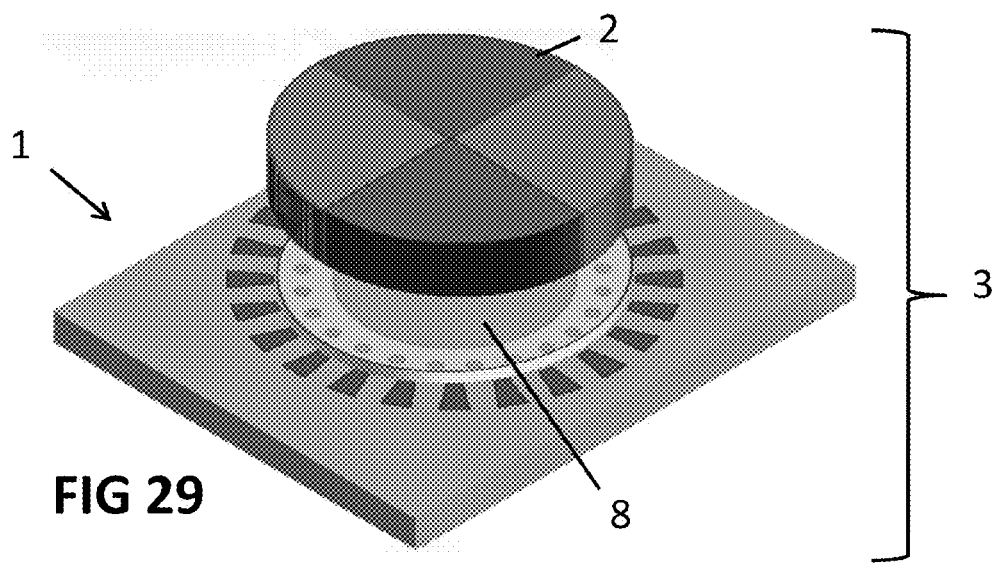
FIG. 29 shows a variant of the arrangement of FIG. 27, whereby the two-pole magnet is replaced by a four-pole magnet.

FIG. 29 shows a variant of the arrangement of FIG. 27, whereby the two-pole magnet 2 is replaced by a four-pole magnet, but the invention is not limited to arrangements with two-pole magnets or four-pole magnets, and arrangements with six-pole magnets, or other multi-pole magnets are also contemplated.

Summarizing, the present invention describes a magnetic field sensor structure 1 having a number of inner and outer and intermediate electrodes 5, 4, 6, arranged in a particular manner, such that groups of four electrodes can be used to form horizontal Hall elements 9.

When such a Hall element is biased, a Hall voltage can be measured, indicative for the strength of the vertical magnetic field component at the location of that Hall element 9. It is possible to simultaneously bias and read-out multiple Hall elements, and to combine the resulting Hall voltages. This may result in structures that are substantially robust, i.e. have a reduced sensitivity to a (constant) external field (fremdfeld), an aspect which is very important e.g. in automobile applications, e.g. in hybrid cars, where large currents can generate large disturbance fields.

An important aspect of embodiments of the structure 1 of the present invention is that neighboring Hall elements "share" one of the two readout electrodes 6. This results in a reduced sensitivity to alignment errors, an effect not obtained in the prior art.

The biasing current always flows in the same radial direction, e.g. inwards, but the sign of the Hall voltage can be changed by connecting the two lines of the intermediate nodes resp. to the positive or negative input, or by swapping them.

Two principally different readout-techniques are proposed: an un-modulated readout-technique, and a modulated read-out technique. The main advantage of using the "modulated readout technique" is that the modulated readout technique allows to combine Hall sensor offset and amplifier offset in the DC domain together and to eliminate them by the following signal demodulation and low-pass filtering in two simple steps. Such architecture does not require complex building blocks or filter structures.

Many specific embodiments of the magnetic field sensor structure 1 according to the present invention are contemplated, depending on combinations of the following parameters:

(1) the number of electrodes N on the structure 1, e.g. N=8 or 16 or 32,
(2) the readout-technique: modulated or unmodulated,
(3) with/without IMC,
(4) how many Hall elements are read-out simultaneously, as discussed in relation to FIG. 10 to FIG. 13.

The following table lists a few examples of embodiments contemplated:

TABLE 1

| readout technique | IMC | number of electrodes (N) | simultaneous readout |
|---|---|---|---|
| unmodulated | no | 8 or 12 or 16 or 20 or 24 or 28 or 32 or 36 or 40 or 44 or 48 or 52 or 56 or 60 or 64 or 72 or 80 or 88 or 96 or 128 or 192 or 256 | no |
| unmodulated | no | 8 or 12 or 16 or 20 or 24 or 28 or 32 or 36 or 40 or 44 or 48 or 52 or 56 or 60 or 64 or 72 or 80 or 88 or 96 or 128 or 192 or 256 | 2 simultaneously, added |
| unmodulated | no | 8 or 12 or 16 or 20 or 24 or 28 or 32 or 36 or 40 or 44 or 48 or 52 or 56 or 60 or 64 or 72 or 80 or 88 or 96 or 128 or 192 or 256 | 2 simultaneously, subtracted |
| unmodulated | no | 8 or 12 or 16 or 20 or 24 or 28 or 32 or 36 or 40 or 44 or 48 or 52 or 56 or 60 or 64 or 72 or 80 or 88 or 96 or 128 or 192 or 256 | 4 simultaneously, added and subtracted |
| unmodulated | no | 8 or 12 or 16 or 20 or 24 or 28 or 32 or 36 or 40 or 44 or 48 or 52 or 56 or 60 or 64 or 72 or 80 or 88 or 96 or 128 or 192 or 256 | 3 simultaneously, added |
| unmodulated | no | 8 or 12 or 16 or 20 or 24 or 28 or 32 or 36 or 40 or 44 or 48 or 52 or 56 or 60 or 64 or 72 or 80 or 88 or 96 or 128 or 192 or 256 | 6 simultaneously, added and subtracted |
| unmodulated | yes | 8 or 12 or 16 or 20 or 24 or 28 or 32 or 36 or 40 or 44 or 48 or 52 or 56 or 60 or 64 or 72 or 80 or 88 or 96 or 128 or 192 or 256 | no |
| unmodulated | yes | 8 or 12 or 16 or 20 or 24 or 28 or 32 or 36 or 40 or 44 or 48 or 52 or 56 or 60 or 64 or 72 or 80 or 88 or 96 or 128 or 192 or 256 | 2 simultaneously, added |
| unmodulated | yes | 8 or 12 or 16 or 20 or 24 or 28 or 32 or 36 or 40 or 44 or 48 or 52 or 56 or 60 or 64 or 72 or 80 or 88 or 96 or 128 or 192 or 256 | 2 simultaneously, subtracted |
| unmodulated | yes | 8 or 12 or 16 or 20 or 24 or 28 or 32 or 36 or 40 or 44 or 48 or 52 or 56 or 60 or 64 or 72 or 80 or 88 or 96 or 128 or 192 or 256 | 4 simultaneously, added and subtracted |
| unmodulated | yes | 8 or 12 or 16 or 20 or 24 or 28 or 32 or 36 or 40 or 44 or 48 or 52 or 56 or 60 or 64 or 72 or 80 or 88 or 96 or 128 or 192 or 256 | 3 simultaneously, added |
| unmodulated | yes | 8 or 12 or 16 or 20 or 24 or 28 or 32 or 36 or 40 or 44 or 48 or 52 or 56 or 60 or 64 or 72 or 80 or 88 or 96 or 128 or 192 or 256 | 6 simultaneously, added and subtracted |
| modulated | no | 8 or 12 or 16 or 20 or 24 or 28 or 32 or 36 or 40 or 44 or 48 or 52 or 56 or 60 or 64 or 72 or 80 or 88 or 96 or 128 or 192 or 256 | no |
| modulated | no | 8 or 12 or 16 or 20 or 24 or 28 or 32 or 36 or 40 or 44 or 48 or 52 or 56 or 60 or 64 or 72 or 80 or 88 or 96 or 128 or 192 or 256 | 2 simultaneously, added |
| modulated | no | 8 or 12 or 16 or 20 or 24 or 28 or 32 or 36 or 40 or 44 or 48 or 52 or 56 or 60 or 64 or 72 or 80 or 88 or 96 or 128 or 192 or 256 | 2 simultaneously, subtracted |
| modulated | no | 8 or 12 or 16 or 20 or 24 or 28 or 32 or 36 or 40 or 44 or 48 or 52 or 56 or 60 or 64 or 72 or 80 or 88 or 96 or 128 or 192 or 256 | 4 simultaneously, added and subtracted |
| modulated | no | 8 or 12 or 16 or 20 or 24 or 28 or 32 or 36 or 40 or 44 or 48 or 52 or 56 or 60 or 64 or 72 or 80 or 88 or 96 or 128 or 192 or 256 | 3 simultaneously, added |
| modulated | no | 8 or 12 or 16 or 20 or 24 or 28 or 32 or 36 or 40 or 44 or 48 or 52 or 56 or 60 or 64 or 72 or 80 or 88 or 96 or 128 or 192 or 256 | 6 simultaneously, added and subtracted |
| modulated | yes | 8 or 12 or 16 or 20 or 24 or 28 or 32 or 36 or 40 or 44 or 48 or 52 or 56 or 60 or 64 or 72 or 80 or 88 or 96 or 128 or 192 or 256 | no |

TABLE 1-continued

| readout technique | IMC | number of electrodes (N) | simultaneous readout |
|---|---|---|---|
| modulated | yes | 8 or 12 or 16 or 20 or 24 or 28 or 32 or 36 or 40 or 44 or 48 or 52 or 56 or 60 or 64 or 72 or 80 or 88 or 96 or 128 or 192 or 256 | 2 simultaneously, added |
| modulated | yes | 8 or 12 or 16 or 20 or 24 or 28 or 32 or 36 or 40 or 44 or 48 or 52 or 56 or 60 or 64 or 72 or 80 or 88 or 96 or 128 or 192 or 256 | 2 simultaneously, subtracted |
| modulated | yes | 8 or 12 or 16 or 20 or 24 or 28 or 32 or 36 or 40 or 44 or 48 or 52 or 56 or 60 or 64 or 72 or 80 or 88 or 96 or 128 or 192 or 256 | 4 simultaneously, added and subtracted |
| modulated | yes | 8 or 12 or 16 or 20 or 24 or 28 or 32 or 36 or 40 or 44 or 48 or 52 or 56 or 60 or 64 or 72 or 80 or 88 or 96 or 128 or 192 or 256 | 3 simultaneously, added |
| modulated | yes | 8 or 12 or 16 or 20 or 24 or 28 or 32 or 36 or 40 or 44 or 48 or 52 or 56 or 60 or 64 or 72 or 80 or 88 or 96 or 128 or 192 or 256 | 6 simultaneously, added and subtracted |

Arrangements 3 according to the present further additionally comprise a magnet, e.g. a 2-pole bar magnet, a 2-pole ring magnet, a 2-pole disk magnet, a 4-pole ring magnet, a 4-pole disk magnet, a 6-pole ring magnet, a 6-pole disk magnet, a 8-pole ring magnet, a 8-pole disk magnet. Based on the above description, the skilled person should be able to select suitable combinations of a specific structure 1 (as listed in table 1) and a particular magnet.

Although in the above description it is assumed that the magnetic field, e.g. the magnet 2 is stationary with respect to the sensor structure 1, it should be mentioned that the structure 1 can also be used and provide relatively accurate results, even when the magnet position is "slowly" varying (as compared to the speed/time required to complete a whole cycle). However, if the magnet 2 is moving "fast", additional compensation techniques should be applied if accurate results are desired, but that falls outside of the scope of the present invention.

The invention claimed is:

1. A magnetic field sensor comprising:
    a structure comprising a ring shaped well provided upon a bulk substrate, and comprising a number of inner electrodes arranged at equidistant angular positions on an inner circle concentric with the well, and the same number of outer electrodes arranged at equidistant angular positions on an outer circle concentric with the well and radially aligned with the inner electrodes for forming pairs of biasing electrodes, and the same number of readout electrodes arranged at equidistant angular positions on an intermediate circle concentric with the well, but angularly shifted with respect to the inner and outer electrodes over 180° divided by said number;
    and a biasing-and-readout circuit comprising a plurality of switches for selectively applying a progressive succession of differently directed bias currents to a pair of biasing electrodes, and for selectively reading a differential Hall voltage over a progressive succession of two readout electrodes located at an equal distance to the selected outer biasing electrode, said biasing electrodes and said readout electrodes forming a horizontal Hall element, said differential Hall voltage being indicative of the relative magnitude of a magnetic field components at the location of said Hall element.

2. The magnetic field sensor according to claim 1, wherein the biasing-and-readout circuit is arranged for selecting the two readout electrodes closest to the selected outer biasing electrode.

3. The magnetic field sensor according to claim 1, wherein the biasing-and-readout circuit is arranged for operating the sensor cyclically, wherein a full progressive succession cycle involves in each step biasing at least one Hall element, and reading the corresponding Hall voltage of that at least one Hall element.

4. The magnetic field sensor according to claim 1,
    further comprising a differential amplifier having at least one differential port with a positive input and a negative input;
    and wherein the biasing-and-readout circuit is further adapted for reading the successive differential Hall voltages by connecting in each step the readout electrode located on the left of the biasing electrodes as seen from the center of the well to the positive input of the differential amplifier, and connecting the readout electrode located of the right of the biasing electrodes as seen from the center of the well to the negative input of a differential amplifier.

5. The magnetic field sensor according to claim 1,
    further comprising a differential amplifier having at least one differential port with a positive input and a negative input;
    and wherein the biasing-and-readout circuit is further adapted for reading the successive differential Hall voltages by connecting in each even step the readout electrode located on the left of the biasing electrodes as seen from the center of the well to the positive input of the differential amplifier, and connecting the readout electrode located of the right of the biasing electrodes as seen from the center of the well to the negative input of a differential amplifier;
    and by connecting in each odd step the readout electrode located on the left of the biasing electrodes as seen from the center of the well to the negative input of the differential amplifier, and connecting the readout electrode located of the right of the biasing electrodes as seen from the center of the well to the positive input of a differential amplifier.

6. The magnetic field sensor according to claim 1, wherein the biasing-and-readout is adapted for biasing and reading only a single Hall element in each successive step.

7. The magnetic field sensor according to claim 1,
    wherein the number of Hall elements is even;
    and wherein the biasing-and-readout circuit is adapted for simultaneously biasing and reading a first Hall element for providing a first differential Hall signal and a second Hall element located at 180° angular distance from the first Hall element for providing a second differential Hall signal;
    and wherein the biasing-and-readout circuit is further adapted for subtracting the first and the second differential Hall signals.

8. The magnetic field sensor according to claim 1,
    wherein the number of Hall elements is even;
    and wherein the biasing-and-readout circuit is adapted for simultaneously biasing and reading a first Hall element for providing a first differential Hall signal and for biasing and reading a second Hall element located at 180° angular distance from the first Hall element for providing a second differential Hall signal;

and wherein the biasing-and-readout circuit is further adapted for adding the first and the second differential Hall signals.

9. The magnetic field sensor according to claim 1,
wherein the number of Hall elements is an integer multiple of four;
and wherein the biasing-and-readout circuit is adapted for simultaneously biasing and reading four Hall element located at 90° angular distance from each other;
and wherein the biasing-and-readout circuit is further adapted for determining the output signal as the sum of the signals of the first and the third Hall element minus the sum of the signals of the second and the fourth Hall element.

10. The magnetic field sensor according to claim 1, further comprising an integrated magnetic concentrator located on top of the well.

11. An angular position sensor for determining an angular position with respect to a permanent magnet, the angular position sensor comprising:
a magnetic field sensor according to claim 1;
an angle determination circuit for determining an angular position based on the succession of differential Hall signals provided by the biasing-and-readout circuit.

12. The angular position sensor according to claim 11, wherein the angle determination circuit comprises a low pass filter or a band-pass filter.

13. The angular position sensor according to claim 11 when dependent on claim 5, further comprising a demodulator for demodulating the amplified signal.

14. An arrangement for measuring an angular position of a rotor with respect to a stator, the arrangement comprising:
the rotor rotatable around a rotation axis;
the stator having a fixed position with respect to the rotation axis;
a permanent magnet mounted on the rotor for creating a magnetic field;
an angular position sensor according to claim 11.

15. A method of determining an angular position of a magnetic field, using the magnetic field sensor according to claim 1, the method comprising the steps:
a) selectively applying a progressive succession of differently directed bias currents to a pair of biasing electrodes, and selectively reading a differential Hall voltage over a progressive succession of the two readout electrodes located at an equal distance to the selected outer biasing electrode, the succession of Hall voltages forming a waveform;
b) amplifying the waveform;
c) low-pass filtering the amplified waveform;
d) determining a phase offset of the low-pass-filtered waveform, as the angular position.

16. A method of determining an angular position of a magnetic field, using the magnetic field sensor according to claim 5, the method comprising the steps:
a) selectively applying a progressive succession of differently directed bias currents to a pair of biasing electrodes, and selectively reading a differential Hall voltage over a progressive succession of the two readout electrodes located at an equal distance to the selected outer biasing electrode;
b) modulating the successively read Hall voltages before amplification;
c) amplifying the modulated Hall voltages;
d) demodulating the amplified modulated Hall voltages;
e) determining a phase offset of the demodulated waveform, as the angular position.

* * * * *